United States Patent
Mitsumoto et al.

(10) Patent No.: US 8,975,638 B2
(45) Date of Patent: Mar. 10, 2015

(54) HIGH-PERFORMANCE ACTIVE MATRIX SUBSTRATE WITH HIGH SIGNAL QUALITY

(75) Inventors: Kazuyori Mitsumoto, Osaka (JP); Masahiro Yoshida, Osaka (JP); Satoshi Horiuchi, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 6 days.

(21) Appl. No.: 13/976,552

(22) PCT Filed: Dec. 22, 2011

(86) PCT No.: PCT/JP2011/079917
§ 371 (c)(1),
(2), (4) Date: Jun. 28, 2013

(87) PCT Pub. No.: WO2012/090879
PCT Pub. Date: Jul. 5, 2012

(65) Prior Publication Data
US 2013/0292681 A1    Nov. 7, 2013

(30) Foreign Application Priority Data
Dec. 28, 2010    (JP) .................................. 2010-292882

(51) Int. Cl.
*G02F 1/1343* (2006.01)
*G06F 3/038* (2013.01)
*G09G 5/00* (2006.01)
*H01L 27/105* (2006.01)
*G02F 1/1362* (2006.01)

(52) U.S. Cl.
CPC ........ *H01L 27/105* (2013.01); *G02F 1/136213* (2013.01)
USPC .............. 257/72; 257/E27.131; 257/E27.152; 345/214; 349/39

(58) Field of Classification Search
USPC ................ 345/107, 214; 257/59, 72, 88, 443, 257/E27.131, E27.132, E27.138, E27.152, 257/E51.005, E29.151, E23.112; 438/149, 438/688, 689; 349/38, 39, 111, 42, 43, 139, 349/199, 37; 361/301.1
See application file for complete search history.

(56) References Cited

U.S. PATENT DOCUMENTS 5,212,574 A * 5/1993 Katayama et al. ............... 349/38
5,343,216 A * 8/1994 Katayama et al. ............... 345/92
5,459,596 A * 10/1995 Ueda et al. ....................... 349/39

(Continued)

FOREIGN PATENT DOCUMENTS

JP    H10-197894 A    7/1998
JP    2000-323698 A    11/2000

(Continued)

*Primary Examiner* — Evan Pert
*Assistant Examiner* — Gustavo Ramallo
(74) *Attorney, Agent, or Firm* — Chen Yoshimura LLP

(57) ABSTRACT

The active matrix substrate is provided with: first and second scan lines (20*a*, 20*b*) that extend in a first direction; first and second signal lines (30*a*, 30*b*) that extend in a second direction; first and second pixels (10*a*, 10*b*) that are arranged adjacent to each other along the second direction; an auxiliary capacitor line (40); first and second pixel electrodes (60*a*, 60*b*); a first TFT (50*a*); a second TFT (50*b*); an auxiliary capacitor electrode (42) that is connected to the auxiliary capacitor line (40) and extends below the first and second pixel electrodes (60*a*, 60*b*); a first auxiliary capacitor counter electrode (62*a*) that is connected to the first pixel electrode (60*a*); and a second auxiliary capacitor counter electrode (62*b*) that is connected to the second pixel electrode (60*b*).

11 Claims, 22 Drawing Sheets

(56) References Cited

U.S. PATENT DOCUMENTS

| | | | |
|---|---|---|---|
| 5,726,721 A * | 3/1998 | Sumiyoshi et al. | 349/54 |
| 6,091,464 A * | 7/2000 | Song | 349/38 |
| 6,252,643 B1 * | 6/2001 | Song | 349/139 |
| 6,642,984 B1 * | 11/2003 | Yoshida et al. | 349/139 |
| 6,738,106 B1 | 5/2004 | Tanahara et al. | 349/38 |
| 6,781,655 B2 * | 8/2004 | Yamazaki et al. | 349/123 |
| 6,784,949 B1 * | 8/2004 | Nagata et al. | 349/39 |
| 6,933,988 B2 * | 8/2005 | Ohgami et al. | 349/39 |
| 7,110,056 B2 * | 9/2006 | Matsui et al. | 349/38 |
| 7,440,039 B2 * | 10/2008 | Enda et al. | 349/38 |
| 7,538,846 B2 * | 5/2009 | Yoshida et al. | 349/147 |
| 7,573,538 B2 * | 8/2009 | Nomura et al. | 349/39 |
| 7,602,452 B2 * | 10/2009 | Kato et al. | 349/38 |
| 7,719,623 B2 * | 5/2010 | Hsieh et al. | 349/39 |
| 7,768,609 B2 * | 8/2010 | Ho et al. | 349/123 |
| 7,791,698 B2 * | 9/2010 | Hirota | 349/130 |
| 8,184,227 B2 * | 5/2012 | Huang et al. | 349/54 |
| 8,248,563 B2 * | 8/2012 | Hsu et al. | 349/139 |
| 8,471,992 B2 * | 6/2013 | Harada et al. | 349/141 |
| 2004/0169991 A1 * | 9/2004 | Nagata et al. | 361/301.1 |
| 2007/0058097 A1 * | 3/2007 | Kato et al. | 349/38 |
| 2010/0238158 A1 * | 9/2010 | Yoshida | 345/214 |
| 2010/0245697 A1 * | 9/2010 | Shiiba et al. | 349/39 |
| 2013/0099816 A1 * | 4/2013 | Kawase et al. | 324/762.03 |

FOREIGN PATENT DOCUMENTS

| | | |
|---|---|---|
| JP | 2007-164100 A | 6/2007 |
| JP | 2010-204249 A | 9/2010 |
| JP | 2010-224141 A | 10/2010 |

* cited by examiner (a)

(b)

(c)

(a)

(b)

HIGH-PERFORMANCE ACTIVE MATRIX SUBSTRATE WITH HIGH SIGNAL QUALITY

TECHNICAL FIELD

The present invention relates to an active matrix substrate used for a display device, an image sensor, and the like.

BACKGROUND ART

Display devices such as a liquid crystal display device, an organic EL (electroluminescence) display device, a flexible display device, and an electronic book are typically provided with an active matrix substrate (also referred to as a "TFT substrate") in which thin film transistors (also referred to as "TFTs" below) are formed as switching elements for respective pixels.

The active matrix substrate includes a plurality of data lines, a plurality of gate lines, a plurality of TFTs disposed for respective intersections thereof, pixel electrodes that apply a voltage to an optical modulation layer such as a liquid crystal layer, auxiliary capacitance wiring lines, auxiliary capacitance electrodes, and the like.

An example of a liquid crystal display device using an active matrix substrate is disclosed in Patent Document 1. FIG. 20 is a plan view showing a part of a plurality of pixels in the active matrix substrate disclosed in Patent Document 1. As shown in FIG. 20, this active matrix substrate includes pixel electrodes 130 and TFTs 140 respectively provided for a plurality of pixels, a plurality of gate lines (scan lines) GL, and a plurality of data lines (signal lines) DL that extend in a direction perpendicular to the plurality of gate lines GL.

In the liquid crystal display device of Patent Document 1, MFD (multi-field driving) is employed in order to increase a writing time to the pixel electrodes 130 and to mitigate flickering. In order to realize the MFD, in this active matrix substrate, two data lines DL extend between two pixel electrodes 130 adjacent to each other in the horizontal direction. Also, in order to increase the aperture ratio, each gate line GL is provided for two pixel electrodes 130. In other words, two pixel electrodes 130 are disposed between two gate lines GL that are adjacent to each other in the vertical direction.

The active matrix substrate is used not only for a display device, but also as a substrate for an image sensor. In the image sensor, photodiodes are disposed on the active matrix substrate for the respective pixels. When light enters the photodiodes, electrical charges are generated due to the photoelectric effect, and the generated electrical charges are temporarily stored in the plurality of pixel electrodes (or pixel capacitances). The stored electrical charges are sequentially read out to the signal lines by turning on and off the respective TFTs through the control signal from the scan lines. This way, an image that entered the image sensor is converted to an image signal. It is also possible to provide a conversion layer that directly converts incident light to electrical charges, instead of photodiodes.

Patent Document 2 discloses a liquid crystal display device and an image sensor that have an active matrix substrate. FIG. 21 is a plan view showing a part of the active matrix substrate disclosed in Patent Document 2. As shown in FIG. 21, the active matrix substrate includes TFTs 140 respectively provided for a plurality of pixels, lower pixel electrodes 130*a*, upper pixel electrodes 130*b*, pixel capacitance electrodes (auxiliary capacitance electrodes) 410, a plurality of gate lines GL, a plurality of data lines DL, and a plurality of pixel capacitance lines (auxiliary capacitance lines) SL.

In each pixel, the lower pixel electrode 130*a* and the upper pixel electrode 130*b* are connected through a contact hole 720 formed in an insulating layer between the two electrodes, and the lower pixel electrode 130*a* and the upper pixel electrode 130*b* function as a pixel electrode. The pixel capacitance line SL and the pixel capacitance electrode 410 are connected through a contact hole 400. A pixel capacitance (auxiliary capacitance) 140*a* is formed by the pixel electrode, the pixel capacitance electrode 410, and a dielectric layer between the two electrodes.

Patent Documents 3 and 4 disclose a display device, an electronic paper, an electronic writing device, and the like that utilize the electrophoresis method. FIGS. 4 and 5 in Patent Document 3, and FIGS. 1 and 2 in Patent Document 4 illustrate configurations of an active matrix substrate for such display devices and the like.

RELATED ART DOCUMENTS

Patent Documents

Patent Document 1: Japanese Patent Application Laid-Open Publication No. H10-197894
Patent Document 2: Japanese Patent Application Laid-Open Publication No. 2000-323698
Patent Document 3: Japanese Patent Application Laid-Open Publication No. 2010-204249
Patent Document 4: Japanese Patent Application Laid-Open Publication No. 2010-224141

SUMMARY OF THE INVENTION

Problems to be Solved by the Invention

In the display device, in order to achieve high quality display, it is necessary to maintain a voltage applied to the pixel electrodes at a sufficient level for a certain period of time. For this reason, in most cases, auxiliary capacitance wiring lines are provided in the active matrix substrate, and auxiliary capacitance electrodes connected to the auxiliary capacitance wiring lines are provided for respective pixels. In this case, above each auxiliary capacitance electrode, an auxiliary capacitance opposite electrode is disposed having an insulating layer or a dielectric layer therebetween, and an auxiliary capacitance is formed by the auxiliary capacitance electrode, the insulating layer, and the auxiliary capacitance opposite electrode. The auxiliary capacitance opposite electrode is connected to the pixel electrode formed thereabove, and the potential of the pixel electrode is maintained for a relatively long period of time as a result of the auxiliary capacitance.

In the image sensor, an auxiliary capacitance (pixel capacitance) for maintaining electrical charges generated by the photoelectron conversion for a sufficient length of time is provided for each pixel with the configuration disclosed in Patent Document 2 above, for example.

However, when auxiliary capacitance lines are provided in an active matrix substrate of a display device, an image sensor, and the like, a large number of intersections between the auxiliary capacitance lines and signal lines are formed. This can cause a problem of a parasitic capacitance generated between the two lines, which causes the SN ratio of the data signal to be lowered, or the signal quality to be lowered due to cross-talk.

In the active matrix substrate of Patent Document 1 shown in FIG. 20, auxiliary capacitance lines, auxiliary capacitance electrodes, or auxiliary capacitance opposite electrodes are not provided, and in this document, no proposal is made regarding the arrangement of the auxiliary capacitance lines, auxiliary capacitance electrodes, or auxiliary capacitance opposite electrodes.

In the active matrix substrate of Patent Document 2 shown in FIG. 21, an auxiliary capacitance is formed by a pixel electrode and a pixel capacitance electrode connected to a pixel capacitance line. However, in the configuration of this active matrix substrate, the signal lines and the pixel capacitance lines extend in a straight line along the vertical direction, and each scan line extends along the horizontal direction between each pair of two pixels adjacent to each other along the vertical direction. Therefore, all signal lines and pixel capacitance lines intersect with all scan lines, which makes signal deterioration more likely to occur due to cross-talk and the like.

FIG. 22 is a plan view that shows a part of a reference example of an active matrix substrate having auxiliary capacitance lines disposed therein. As shown in the figure, an active matrix substrate 200 of the reference example is provided with a plurality of pixels 210 arranged in a matrix, a plurality of scan lines 220, a plurality of signal lines 230 extending perpendicularly to the scan lines 220, and a plurality of auxiliary capacitance lines 240 extending in parallel with the scan lines 220. In each pixel 210, a TFT 250, a pixel electrode 260, an auxiliary capacitance electrode 242, and an auxiliary capacitance opposite electrode 262 are disposed. The auxiliary capacitance electrode 242 is made of a part of the auxiliary capacitance line 240 (wider portion near the center of the pixel 210). The auxiliary capacitance opposite electrode 262 is connected to the drain electrode of the TFT 250, and is also connected to the pixel electrode 260 through a contact hole formed in an interlayer insulating layer near the center of the pixel 210.

With the active matrix substrate 200 of the reference example, because the scan lines 220 and the auxiliary capacitance lines 240 do not intersect with each other, the two lines and the auxiliary capacitance electrodes 242 can be formed in the same layer. This eliminates a need to form contact holes for connecting the auxiliary capacitance lines 240 to the auxiliary capacitance electrodes 242, and the active matrix substrate 200 can be manufactured with greater ease.

However, in the active matrix substrate 200 of the reference example, the signal lines 230 intersect with all of the scan lines 220 and auxiliary capacitance lines 240, and therefore, it is possible that the signal quality is lowered.

The present invention was made in view of the above-mentioned situation, and an object thereof is to provide a high performance active matrix substrate that can secure a sufficient auxiliary capacitance and that can maintain high signal quality.

Means for Solving the Problems

An active matrix substrate of an embodiment of the present invention includes: a plurality of scan lines extending along a first direction, the plurality of scan lines including a first scan line and a second scan line that are adjacent to each other; a plurality of signal lines extending along a second direction, the plurality of signal lines including a first signal line and a second signal line that are adjacent to each other; a plurality of pixels arranged in a matrix, the plurality of pixels including a first pixel and a second pixel that are adjacent to each other along the second direction; an auxiliary capacitance line; a first pixel electrode for the first pixel and a second pixel electrode for the second pixel that are disposed in a region surrounded by the first scan line, the second scan line, the first signal line, and the second signal line; a first TFT for the first pixel, the first TFT being connected to the first signal line; a second TFT for the second pixel, the second TFT being connected to the second signal line; an auxiliary capacitance electrode connected to the auxiliary capacitance line, the auxiliary capacitance electrode extending under the first pixel electrode and the second pixel electrode; a first auxiliary capacitance opposite electrode for the first pixel, the first auxiliary capacitance opposite electrode being connected to the first pixel electrode; and a second auxiliary capacitance opposite electrode for the second pixel, the second auxiliary capacitance opposite electrode being connected to the second pixel electrode.

In an embodiment, the auxiliary capacitance line extends along the second direction, the first TFT is positioned on a positive side of the auxiliary capacitance line along the first direction, and the second TFT is positioned on a negative side of the auxiliary capacitance line along the first direction.

In an embodiment, the auxiliary capacitance line extends along the second direction while bending, the first auxiliary capacitance opposite electrode is positioned on the positive side of the auxiliary capacitance line along the first direction, and the second auxiliary capacitance opposite electrode is positioned on the negative side of the auxiliary capacitance line along the first direction.

In an embodiment, a width of the plurality of scan lines at first intersections where the auxiliary capacitance line and the plurality of scan lines intersect is smaller than a width of the plurality of scan lines in other areas than the first intersections at boundaries between the plurality of pixels.

In an embodiment, a width of the plurality of scan lines at second intersections where the plurality of signal lines and the plurality of scan lines intersect is smaller than a width of the plurality of scan lines in other areas than the second intersections at boundaries between the plurality of pixels.

In an embodiment, the auxiliary capacitance line has a section extending along the second direction and a section extending at an angle relative to the second direction in the first and second pixels.

In an embodiment, the auxiliary capacitance line has a section extending in a straight line along the first direction in the first pixel, a section extending in a straight line along the second direction at a boundary between the first and second pixels, and a section extending in a straight line along the first direction in the second pixel.

In an embodiment, the active matrix substrate further includes a second auxiliary capacitance line extending along the first direction, the second auxiliary capacitance line being connected to the auxiliary capacitance electrode, and the auxiliary capacitance electrode and the second auxiliary capacitance line are made of the same material.

In an embodiment, the auxiliary capacitance electrode, the first scan line, and the second scan line are formed of the same material in the same layer, and the first auxiliary capacitance opposite electrode, the second auxiliary capacitance opposite electrode, the first signal line, and the second signal line are formed of the same material in the same layer.

In an embodiment, the auxiliary capacitance electrode, the first signal line, and the second signal line are formed of the same material in the same layer, and the first auxiliary capacitance opposite electrode, the second auxiliary capacitance opposite electrode, the first scan line, and the second scan line are formed of the same material in the same layer.

In an embodiment, the auxiliary capacitance line extends in a straight line along the second direction, the first auxiliary capacitance opposite electrode is divided into a first section and a second section, the first section being positioned on the positive side of the auxiliary capacitance line along the first direction, the second section being positioned on the negative side of the auxiliary capacitance line along the first direction, and the second auxiliary capacitance opposite electrode is divided into a first section and a second section, the first section being positioned on the positive side of the auxiliary capacitance line along the first direction, the second section being positioned on the negative side of the auxiliary capacitance line along the first direction.

In an embodiment, the first section of the first auxiliary capacitance opposite electrode is connected to a drain electrode of the first TFT, the first section and the second section of the first auxiliary capacitance opposite electrode are respectively connected to the first pixel electrode through contact holes, the second section of the second auxiliary capacitance opposite electrode is connected to a drain electrode of the second TFT, and the first section and the second section of the second auxiliary capacitance opposite electrode are respectively connected to the second pixel electrode through contact holes.

In an embodiment, the first pixel electrode and the second pixel electrode are formed covering the first signal line and the second signal line.

In an embodiment, the active matrix substrate further includes: a third pixel adjacent to the first pixel across the first scan line; a fourth pixel adjacent to the second pixel across the second scan line; a third TFT for the third pixel, the third TFT being connected to the first signal line; a fourth TFT for the fourth pixel, the fourth TFT being connected to the second signal line; a third auxiliary capacitance opposite electrode for the third pixel, the third auxiliary capacitance opposite electrode being connected to a pixel electrode of the third pixel; and a fourth auxiliary capacitance opposite electrode for the fourth pixel, the fourth auxiliary capacitance opposite electrode being connected to a pixel electrode of the fourth pixel, wherein the auxiliary capacitance line extends along the second direction, wherein the first TFT, the second TFT, the first auxiliary capacitance opposite electrode, and the second auxiliary capacitance opposite electrode are positioned on a positive side of the auxiliary capacitance line along the first direction, and wherein the third TFT, the fourth TFT, the third auxiliary capacitance opposite electrode, and the fourth auxiliary capacitance opposite electrode are positioned on a negative side of the auxiliary capacitance line along the first direction.

In an embodiment, the active matrix substrate further includes: a fifth pixel adjacent to the first pixel across the first signal line; a sixth pixel adjacent to the second pixel across the first signal line; a fifth TFT for the fifth pixel, the fifth TFT being connected to the first scan line; a sixth TFT for the sixth pixel, the sixth TFT being connected to the second scan line; a fifth auxiliary capacitance opposite electrode for the fifth pixel, the fifth auxiliary capacitance opposite electrode being connected to a pixel electrode of the fifth pixel; a sixth auxiliary capacitance opposite electrode for the sixth pixel, the sixth auxiliary capacitance opposite electrode being connected to a pixel electrode of the sixth pixel, and another auxiliary capacitance line that extends along the second direction, passing through the fifth pixel and the sixth pixel, wherein the fifth TFT and the fifth auxiliary capacitance opposite electrode are positioned on the negative side of the other auxiliary capacitance line along the first direction, and wherein the sixth TFT and the sixth auxiliary capacitance opposite electrode are positioned on the positive side of the other auxiliary capacitance line along the first direction.

In an embodiment, the active matrix substrate further includes: a fifth pixel adjacent to the first pixel across the first signal line; a sixth pixel adjacent to the second pixel across the first signal line; a fifth TFT for the fifth pixel, the fifth TFT being connected to the first signal line; a sixth TFT for the sixth pixel, the sixth TFT being connected to the second signal line; a fifth auxiliary capacitance opposite electrode for the fifth pixel, the fifth auxiliary capacitance opposite electrode being connected to a pixel electrode of the fifth pixel; a sixth auxiliary capacitance opposite electrode for the sixth pixel, the sixth auxiliary capacitance opposite electrode being connected to a pixel electrode of the sixth pixel, and another auxiliary capacitance line that extends along the second direction, passing through the fifth pixel and the sixth pixel, wherein the fifth TFT, the sixth TFT, the fifth auxiliary capacitance opposite electrode, and the sixth auxiliary capacitance opposite electrode are positioned on the negative side of the other auxiliary capacitance line along the first direction.

In an embodiment, the first signal line and the second signal line extend along the second direction while bending, the auxiliary capacitance line extends in a straight line along the second direction, the first TFT and the first auxiliary capacitance opposite electrode are positioned on a positive side of the auxiliary capacitance line along the first direction, and wherein the second TFT and the second auxiliary capacitance opposite electrode are positioned on a negative side of the auxiliary capacitance line along the first direction.

In an embodiment, the first signal line, the second signal line, and the auxiliary capacitance line extend along the second direction while bending, the first TFT and the first auxiliary capacitance opposite electrode are positioned closer to a positive side of the auxiliary capacitance line along the first direction, and the second TFT and the second auxiliary capacitance opposite electrode are positioned on a negative side of the auxiliary capacitance line along the first direction.

In an embodiment, the auxiliary capacitance line extends along the first direction, the first TFT and the first auxiliary capacitance opposite electrode are positioned on a positive side of the auxiliary capacitance line along the second direction, and the second TFT and the second auxiliary capacitance opposite electrode are positioned on a negative side of the auxiliary capacitance line along the second direction.

In an embodiment, a width of the auxiliary capacitance line at third intersections where the auxiliary capacitance line and the plurality of signal lines intersect is smaller than a width of the auxiliary capacitance line in other areas than the third intersections at boundaries between the plurality of pixels.

In an embodiment, a width of the plurality of scan lines at fourth intersections where the plurality of signal lines and the plurality of scan lines intersect is smaller than a width of the plurality of scan lines at boundaries between the plurality of pixels.

In an embodiment, a width of the plurality of signal lines at the third intersections and the fourth intersections is smaller than a width of the plurality of scan lines in other areas than the third intersections and the fourth intersections.

In an embodiment, an active matrix substrate includes: a plurality of scan lines extending generally in a first direction; a plurality of bundled pairs of signal lines extending generally in a second direction and intersecting with the plurality of scan lines, the scan lines and the bundled pairs of signal lines defining a matrix; a plurality of pixels arranged in a matrix with two pixels included in each of matrix units of the matrix defined by the scan lines and the bundled pairs of signal lines, each pixel including: a thin film transistor; a pixel electrode electrically connected to the thin film transistor; and an auxiliary capacitance opposite electrode electrically connected to the pixel electrode; an auxiliary capacitance line; and an auxiliary capacitance electrode in each of the matrix unit of the matrix defined by the scan lines and the bundled pairs of signal lines, the auxiliary capacitance electrode being connected to the auxiliary capacitance line and overlapping with the auxiliary capacitance opposite electrodes of the two pixels within each matrix unit, wherein each of the scan line is connected to the respective thin film transistors of two rows of pixels, one above the scan line and one below the scan line, to select the two rows of pixels at the same time, and the selected pixels in a same column are respectively connected to different ones of signal lines.

Effects of the Invention

According to embodiments of the present invention, the number of scan lines and auxiliary capacitance lines that intersect with the signal lines is reduced. This makes it possible to prevent the deterioration of signal data, which allows for high quality display by a display device and high quality data collection by an image sensor. Also, according to embodiments of the present invention, it is possible to form auxiliary capacitance electrodes and auxiliary capacitance opposite electrodes having a large area, which makes it possible to obtain sufficiently large auxiliary capacitances.

DETAILED DESCRIPTION OF EMBODIMENTS

Below, with reference to figures, an active matrix substrate of embodiments of the present invention will be explained. However, the scope of the present invention is not limited to the embodiments below.

An active matrix substrate of embodiments of the present invention is used as an active matrix substrate of an electronic paper, a display device, an electronic writing device, a liquid crystal display device, or an image sensor that employs the electrophoresis method and the like, as in Patent Documents above. The active matrix substrate of embodiments of the present invention can also be used as an active matrix substrate for an organic EL display device, a flexible display utilizing liquid crystal, organic EL, or the like, an X-ray sensor, and the like. When the active matrix substrate of embodiments of the present invention is used for such devices, other constituting elements than the active matrix substrate described below, such as an opposite substrate and peripheral wiring, may have known configurations.

Embodiment 1

Figure 1:
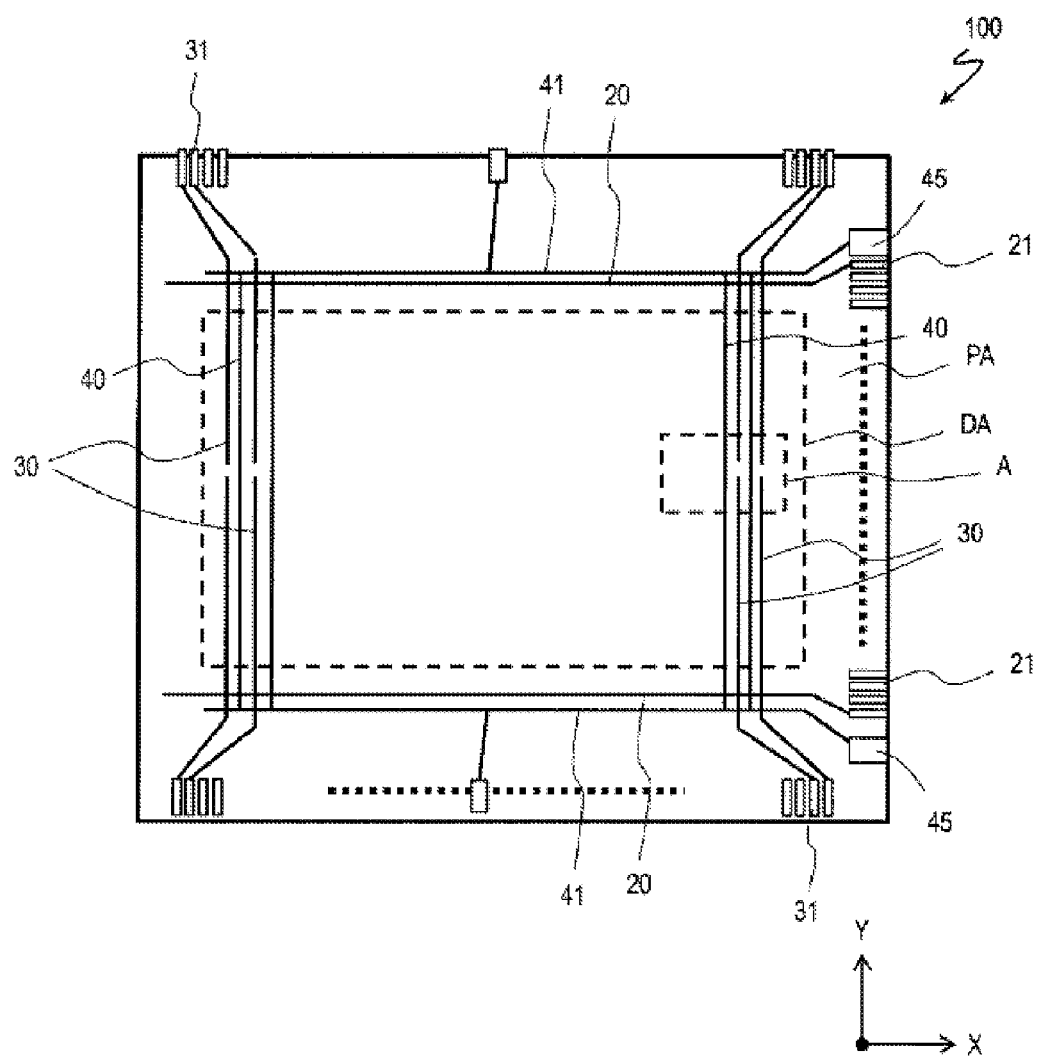
FIG. 1 is a plan view that schematically shows a configuration of an active matrix substrate 100 according to Embodiment 1 of the present invention.

FIG. 1 is a plan view that schematically shows a configuration of an active matrix substrate 100 of an embodiment of the present invention.

As shown in FIG. 1, the active matrix substrate 100 includes a display region DA in which a plurality of pixels are arranged in a matrix, and a peripheral region PA that is provided surrounding the display region DA. Near edges of the peripheral region PA, a plurality of scan line terminals 21, signal line terminals 31, and auxiliary capacitance line terminals 45 are disposed. The respective scan line terminals 21 are connected to scan lines (gate bus lines) 20 that extend along the X direction (horizontal direction in the figure: first direction). The respective signal line terminals 31 are connected to signal lines (source bus lines) 30 that extend along the Y direction (vertical direction in the figure: second direction). The respective auxiliary capacitance line terminals 45 are connected to auxiliary capacitance main lines 41 that extend along the X direction. From the respective auxiliary capacitance main lines 41, a plurality of auxiliary capacitance lines (Cs lines) are extended in the Y direction.

Although not shown in the figure, in the peripheral region PA, electrical elements such as a scan line driver circuit, a signal line driver circuit, and a voltage supply circuit are disposed with the COG (chip on glass) method. Also, near the outer edge of the peripheral region PA, terminals for attaching external elements such as an FPC (flexible printed circuit) are provided.

Figure 2:
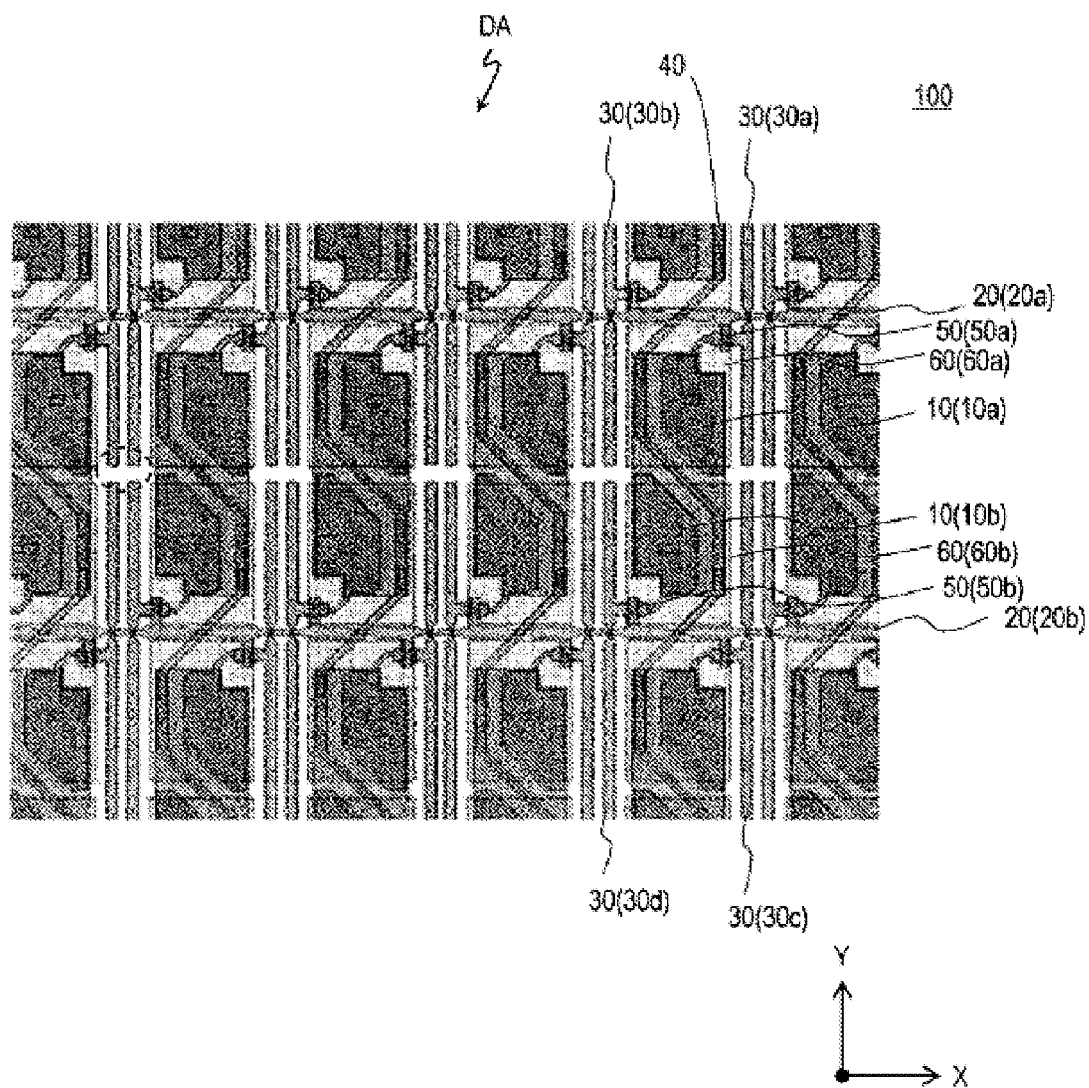
FIG. 2 is a plan view that schematically shows a configuration of a display region DA in the active matrix substrate 100.
Figure 3:
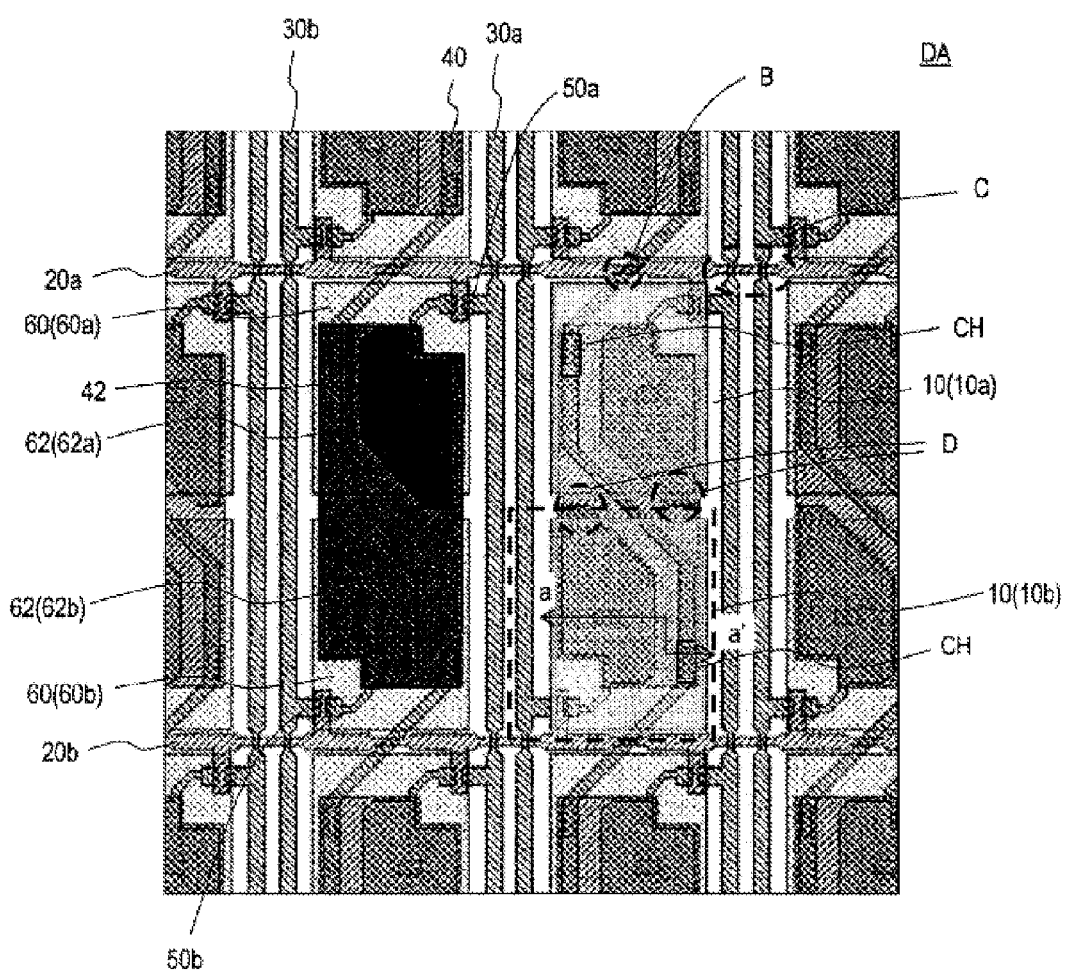
FIG. 3 is an enlarged plan view of a part of the display region DA in the active matrix substrate 100.

FIG. 2 is a plan view that shows a part of the display region DA (section A in FIG. 1) of the active matrix substrate 100, and FIG. 3 is an enlarged plan view of a part of FIG. 2.

As shown in FIGS. 2 and 3, a plurality of pixels 10 are arranged in a matrix in the display section DA, and along the boundaries between the plurality of pixels 10, a plurality of scan lines 20 and a plurality of signal lines 30 extend so as to intersect with each other. Each pixel 10 includes a TFT 50 disposed near a corner thereof, and a pixel electrode 60 that is disposed to cover the pixel almost entirely and that is made of ITO (indium tin oxide), for example. The gate electrode, the source electrode, and the drain electrode of each TFT 50 are connected to a scan line 20, a signal line 30, and a pixel electrode 60, respectively. For each pixel column that extends along the Y direction, an auxiliary capacitance line 40 is provided so as to extend along the Y direction while bending.

In each pixel 10, an auxiliary capacitance electrode (Cs electrode) 42 connected to an auxiliary capacitance line 40 and an auxiliary capacitance opposite electrode (Cs opposite electrode) 62 connected to a pixel electrode 60 are provided, and an auxiliary capacitance is formed by the auxiliary capacitance electrode 42, the auxiliary capacitance opposite electrode 62, and an insulating layer or a dielectric layer interposed therebetween.

Figure 22:
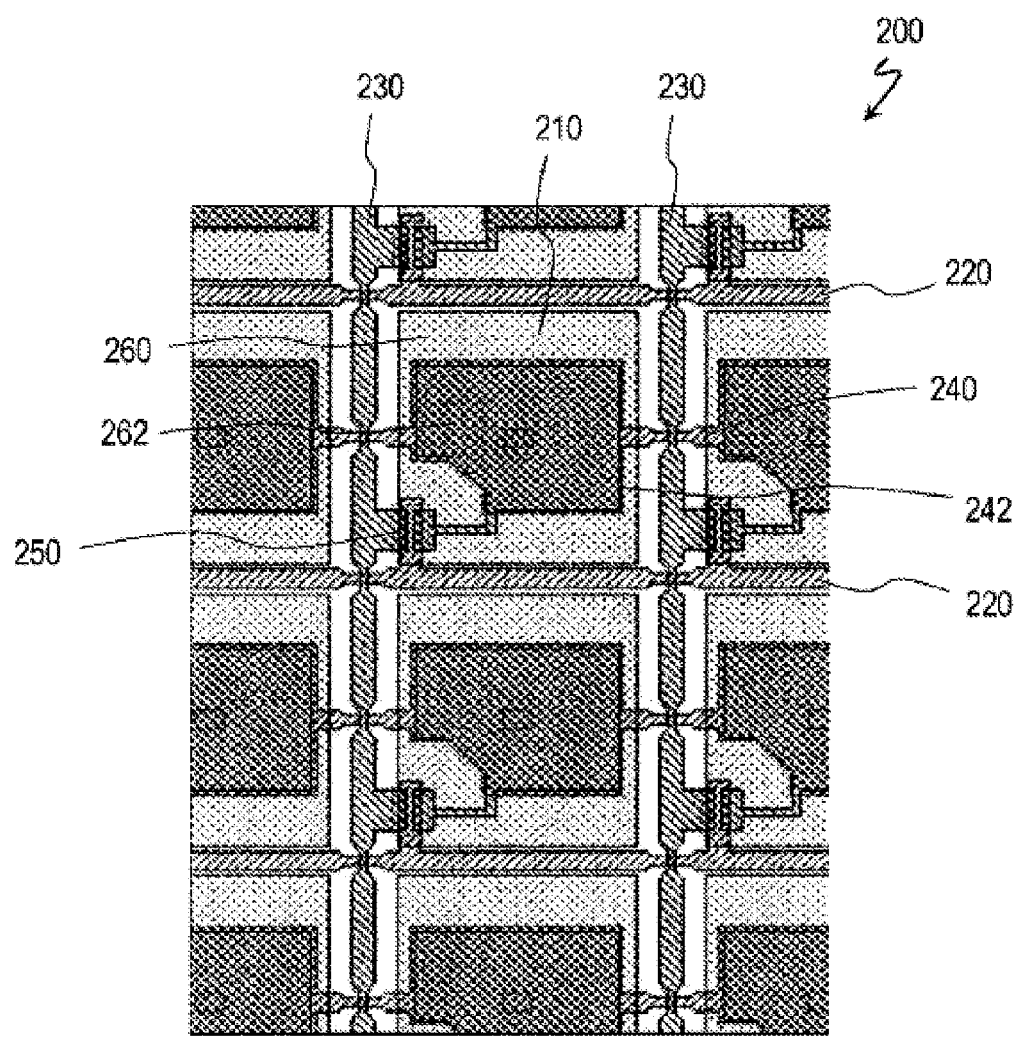
FIG. 22 is a plan view showing a configuration of pixels in the active matrix substrate of a reference example.

As shown in FIGS. 1 and 2, each signal line 30 is discontinued near the center of the display region DA, and one signal line terminal 31 is provided for each of the signal line 30 extending to the top and the signal line 30 extending to the bottom. For example, in a typical active matrix substrate for a display device shown in FIG. 22, 768 scan lines and 3072 signal lines are used, but in the present embodiment, the number of the signal lines 30 doubles. By providing the signal lines in this manner, a data read-out period or data writing period (TFT select period) can be made twice as long as the typical configuration, and also, it is possible to reduce a load on each signal line. This allows for higher quality display or higher quality data acquisition.

Figure 4:
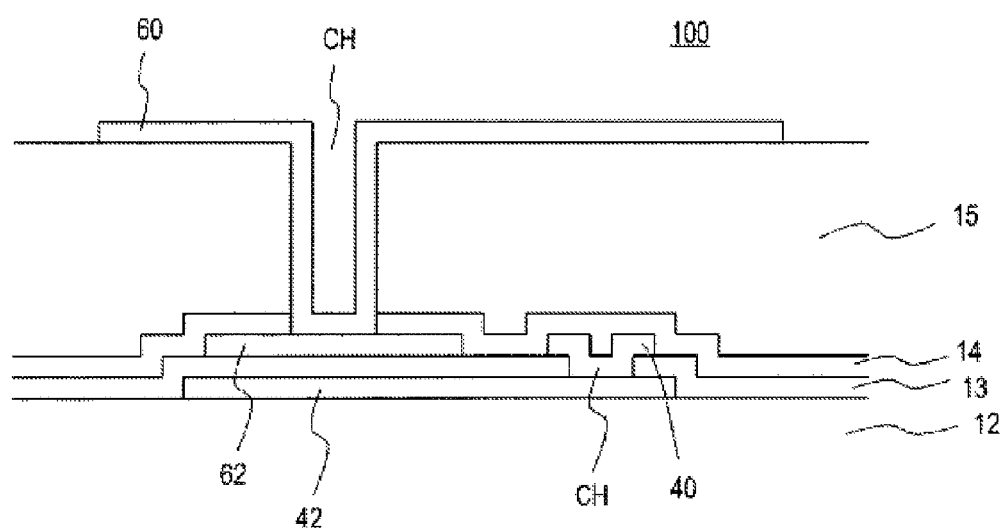
FIG. 4 is a schematic cross-sectional view of a configuration of the active matrix substrate 100 along the line a-a' of FIG. 3.

FIG. 4 shows a schematic cross-sectional configuration of the active matrix substrate 100 along the line a-a' of FIG. 3.

As shown in FIG. 4, the active matrix substrate 100 includes: a substrate 12 such as a glass substrate; an auxiliary capacitance electrode (Cs electrode) 42 formed on the substrate 12; an insulating layer (also referred to as a first inorganic insulating film or a gate insulating film) 13 deposited on the substrate 12 so as to cover the auxiliary capacitance electrode 42; an auxiliary capacitance line 40 and an auxiliary capacitance opposite electrode (Cs upper electrode) 62 formed on the insulating layer 13; an insulating layer (also referred to as a second inorganic insulating film or a protective film) 14 deposited on the insulating layer 13 so as to cover the auxiliary capacitance line 40 and the auxiliary capacitance opposite electrode 62; and an insulating layer (also referred to as an organic insulating film or an interlayer insulating film) 15 deposited on the insulating layer 14. The insulating layers 13 and 14 are made of silicon nitride or silicon oxide, for example.

It is preferable that the insulating layer 15 be made of a material having a low permittivity so as to reduce the parasitic capacitance between the pixel electrode 60 and the signal line 30. Thus, it is preferable to form the insulating layer 14 of silicon nitride to a thickness of 0.3 μm, for example, and to form the insulating layer 15 to a thickness of 3.0 μm by using a photosensitive acrylic resin with a relative permittivity of approximately 3.4, for example.

The pixel electrode 60 is formed on the insulating layer 15. The pixel electrode 60 is connected to the auxiliary capacitance opposite electrode 62 through a contact hole CH formed in the insulating layer 15, and the auxiliary capacitance line 40 is connected to the auxiliary capacitance electrode 42 through a contact hole CH formed in the insulating layer 13.

The auxiliary capacitance electrodes 42, the scan lines 20, and the gate electrodes of TFTs 50 are formed by patterning a metal layer in the same process, and are therefore made of the same metal material. The auxiliary capacitance electrodes 42, the scan lines 20, and the gate electrodes of the TFTs 50 are made of a metal layer having a TiN/Al/Ti three-layer structure in which Al (aluminum) and TiN (titanium nitride) are layered on Ti (titanium), for example. Alternatively, the metal layer may have a multi-layer structure of Ti/Al/Ti, Al/Ti, Cu (copper)/Ti, Cu/Mo (molybdenum), and the like, or may have a single layer structure made of one of these metals.

The auxiliary capacitance lines 40, the auxiliary capacitance opposite electrodes 62, the signal lines 30, and the source electrodes and drain electrodes of the TFTs 50 are formed by patterning a metal layer in the same process, and are therefore made of the same metal material. The auxiliary capacitance lines 40, the auxiliary capacitance opposite electrodes 62, the signal lines 30, and the source electrodes and drain electrodes of the TFTs 50 are made of a metal layer having an Al/Ti two-layer structure, for example. Alternatively, the metal layer may have a multi-layer structure of Cu/Ti, Cu/Mo, Ti/Al/Ti, and the like. Accordingly, the metal layer may have the multi-layer structure or single layer structure for the scan lines 20 as mentioned previously.

Next, with reference to FIGS. 2 and 3, the configuration of the display region DA will be explained in further detail.

In the display region DA, between respective two adjacent scan lines 20 along the Y direction (the scan line on the top (first scan line) is denoted by 20a, and the scan line on the bottom (second scan line) is denoted by 20b), pairs of two pixels 10 are respectively disposed (each upper pixel (first pixel) is denoted by 10a, and each lower pixel (second pixel) is denoted by 10b). Each pair of pixels 10a and 10b is disposed between two adjacent signal lines 30 (a signal line on the right side (first signal line) is denoted by 30a, and a signal line on the left side (second signal line) is denoted by 30b). Between respective two pixels 10 adjacent to each other along the X direction, two signal lines 30a and 30b are extended.

In each pixel 10a, a TFT (first TFT) 50a, a pixel electrode (first pixel electrode) 60a, and an auxiliary capacitance opposite electrode (first auxiliary capacitance opposite electrode) 62a are disposed, and in each pixel 10b, a TFT (second TFT) 50b, a pixel electrode (second pixel electrode) 60b, and an auxiliary capacitance opposite electrode (second auxiliary capacitance opposite electrode) 62b are disposed.

The gate electrode, source electrode, and drain electrode of the TFT 50a are connected to a scan line 20a, a signal line 30a, and an auxiliary capacitance opposite electrode 62a, respectively. Because the auxiliary capacitance opposite electrode 62a and the pixel electrode 60a are connected to each other through a contact hole CH formed in the insulating layer 15, the pixel electrode 60a is electrically connected to the drain electrode of the TFT 50a. The gate electrode, source electrode, and drain electrode of the TFT 50b are connected to a scan line 20b, a signal line 30b, and an auxiliary capacitance opposite electrode 62b, respectively. Because the auxiliary capacitance opposite electrode 62b and the pixel electrode 60b are connected to each other through a contact hole CH formed in the insulating layer 15, the pixel electrode 60b is electrically connected to the drain electrode of the TFT 50b.

The auxiliary capacitance electrode 42 disposed in a region surrounded by the scan lines 20a and 20b and the signal lines 30a and 30b functions as an auxiliary capacitance electrode for the two pixels 10a and 10b. The auxiliary capacitance electrode 42 is connected to an auxiliary capacitance line 40 through a contact hole CH formed in the insulating layer 13 in the pixel 10a, and through a contact hole CH formed in the insulating layer 13 in the pixel 10b. When viewing from the normal direction to the substrate plane, the auxiliary capacitance electrode 42 extends such that the auxiliary capacitance opposite electrodes 62a and 62b are included within the auxiliary capacitance electrode 42.

The auxiliary capacitance line 40 extends along the second direction while bending so as to pass through the pixels 10a and 10b, avoiding the TFTs 50a and 50b. In other words, the auxiliary capacitance line 40 has a portion that extends in a straight line along the Y direction and a portion that extends at an angle relative to the Y direction in the pixels 10a and 10b. The TFT 50a and the auxiliary capacitance opposite electrode 62a are located closer to the positive side (right side in the figure) of the auxiliary capacitance line 40 along of the X direction. The TFT 50b and the auxiliary capacitance opposite electrode 62b are located closer to the negative side (left side in the figure) of the auxiliary capacitance line 40 along the X direction.

With the active matrix substrate 100 of the present embodiment, it is possible to scan two pixels adjacent to each other along the Y direction with a single scan line. This makes it possible to reduce the number of scan lines by half, thereby reducing the number of intersections between the scan lines and the signal lines. Also, it is possible to dispose auxiliary capacitance lines so as not to intersect with the signal lines. This makes it possible to ensure an auxiliary capacitance for each pixel, and the deterioration of signal quality can also be prevented. By forming the auxiliary capacitance lines so as to bend, it is possible to form an auxiliary capacitance opposite electrode of a large area with a simpler configuration. As a result, a larger auxiliary capacitance can be obtained through a smaller number of contact holes, which results in high manufacturing efficiency.

Because the number of scan lines is reduced as described above, it is possible to double the data read-out period or writing period (TFT select period) as compared with a typical configuration, which allows for higher quality display or higher quality data acquisition. In addition to a reduction in number of scan lines, the size of TFTs can be reduced (the channel length can be reduced, for example), and therefore, it is possible to reduce a parasitic capacitance in each TFT (capacitance between the gate electrode and the drain electrode, for example), which results in a reduction in load on the scan lines. Also, because a distance between a TFT and an auxiliary capacitance electrode and the like can be increased, it is possible to reduce a leak defect. In a transmissive liquid crystal display device, the aperture ratio can be improved.

B in FIG. 3 denotes an intersection (first intersection) of an auxiliary capacitance line 40 and a scan line 20. The width of the scan line 20 at the intersection B is smaller than the width of the scan line 20 in other areas than the intersection B along the boundary between each pair of two pixels 10 that are adjacent to each other in the Y direction. The width of the scan line 20 at each intersection (second intersection) C of a signal line 30 and a scan line 20 is smaller than the width of the scan line 20 in other areas than the intersections B and C. As described above, by making the wiring width smaller at the wiring intersections, the intersection area of the wiring lines is reduced, and therefore, it is possible to reduce a capacitance that can be generated between the wiring lines. As a result, higher quality signals can be provided, and excellent display and data acquisition are made possible.

Figure 5:
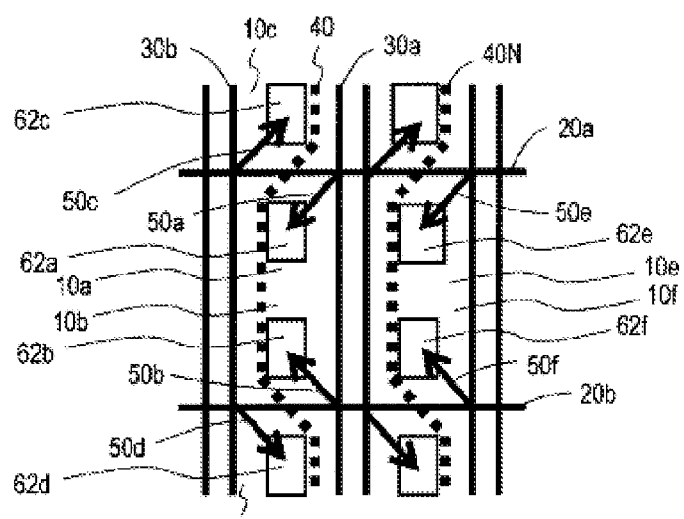
FIGS. 5(a) to 5(c) are schematic plan views that respectively show first to third modification examples of the pixel configuration of Embodiment 1.
Figure 5:
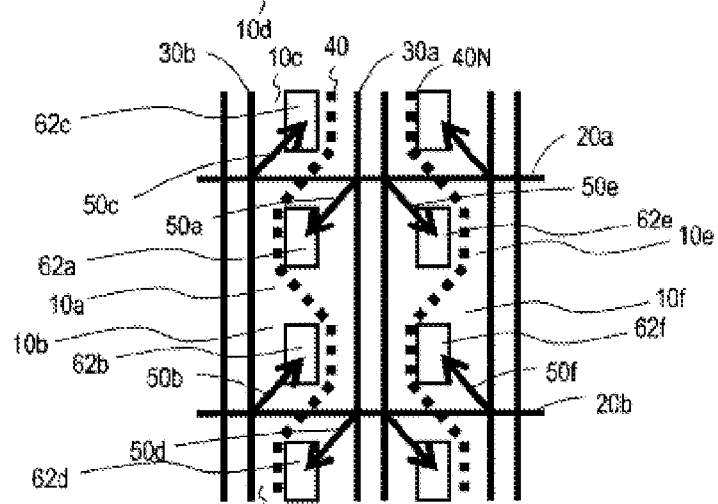
Figure 5:
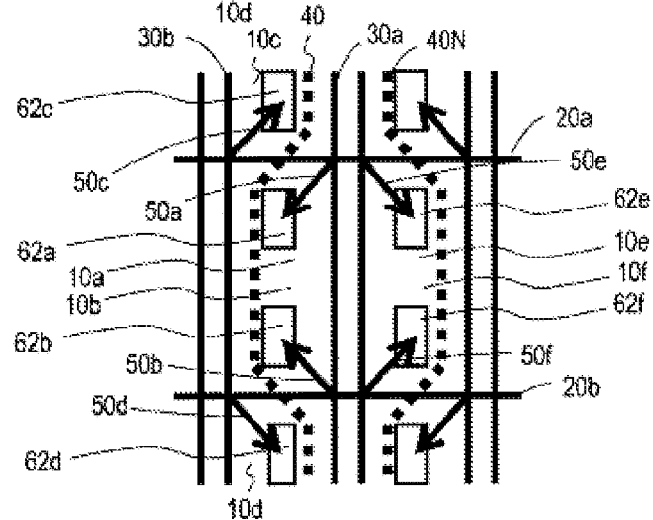

Next, with reference to FIGS. 5 and 6, first to fifth modification examples of the pixel configuration of Embodiment 1 will be explained. FIGS. 5(a) to 5(c) are plan views that schematically show first to third modification examples, respectively, and FIGS. 6(a) and 6(b) are plan views that schematically show fourth and fifth modification examples, respectively. In FIGS. 6(a) and 6(b), for ease of explanation, the direction from right to left in the figure is the positive X direction.

In these modification examples, a pixel (third pixel) that is adjacent to the pixel 10a across the scan line 20a is a pixel 10c, and a TFT (third TFT) and an auxiliary capacitance opposite electrode (third auxiliary capacitance opposite electrode) of each pixel 10c are denoted by 50c and 62c, respectively. A pixel (fourth pixel) that is adjacent to the pixel 10b across the scan line 20b is a pixel 10d, and a TFT (fourth TFT) and an auxiliary capacitance opposite electrode (fourth auxiliary capacitance opposite electrode) of each pixel 10d are denoted by 50d and 62d, respectively. A pixel (fifth pixel) 10e that is adjacent to the pixel 10a across the signal line 30a includes a TFT (fifth TFT) 50e and an auxiliary capacitance opposite electrode (fifth auxiliary capacitance opposite electrode) 62e. A pixel (sixth pixel) 10f that is adjacent to the pixel 10b across the signal line 30a includes a TFT (sixth TFT) 50f and an auxiliary capacitance opposite electrode (sixth auxiliary capacitance opposite electrode) 62f. An auxiliary capacitance line (another auxiliary capacitance line) that extends in the second direction, passing through the pixels 10e and 10f, is an auxiliary capacitance line 40N.

In the first modification example, as shown in FIG. 5(a), the TFT 50a, the auxiliary capacitance opposite electrode 62a, the TFT 50b, and the auxiliary capacitance opposite electrode 62b are located closer to the positive side of the auxiliary capacitance line 40 along the X direction, and the TFT 50c, the auxiliary capacitance opposite electrode 62c, the TFT 50d, and the auxiliary capacitance opposite electrode 62d are located closer to the negative side of the auxiliary capacitance line 40 along the X direction. The TFT 50e, the auxiliary capacitance opposite electrode 62e, the TFT 50f, and the auxiliary capacitance opposite electrode 62f are located closer to the positive side of the auxiliary capacitance line 40N along the X direction.

In the second modification example, as shown in FIG. 5(b), the TFT 50a, the auxiliary capacitance opposite electrode 62a, the TFT 50d, and the auxiliary capacitance opposite electrode 62d are located closer to the positive side of the auxiliary capacitance line 40 along the X direction, and the TFT 50b, the auxiliary capacitance opposite electrode 62b, the TFT 50c, and the auxiliary capacitance opposite electrode 62c are located closer to the negative side of the auxiliary capacitance line 40 along the X direction. The TFT 50e and the auxiliary capacitance opposite electrode 62e are located closer to the negative side of the auxiliary capacitance line 40N along the X direction, and the TFT 50f and the auxiliary capacitance opposite electrode 62f are located closer to the positive side of the auxiliary capacitance line 40N along the X direction.

In the third modification example, as shown in FIG. 5(c), the TFT 50a, the auxiliary capacitance opposite electrode 62a, the TFT 50b, and the auxiliary capacitance opposite electrode 62b are located closer to the positive side of the auxiliary capacitance line 40 along the X direction, and the TFT 50c, the auxiliary capacitance opposite electrode 62c, the TFT 50*d*, and the auxiliary capacitance opposite electrode 62*d* are located closer to the negative side of the auxiliary capacitance line 40 along the X direction. The TFT 50*e*, the auxiliary capacitance opposite electrode 62*e*, the TFT 50*f*, and the auxiliary capacitance opposite electrode 62*f* are located closer to the negative side of the auxiliary capacitance line 40N along the X direction.

Figure 6:
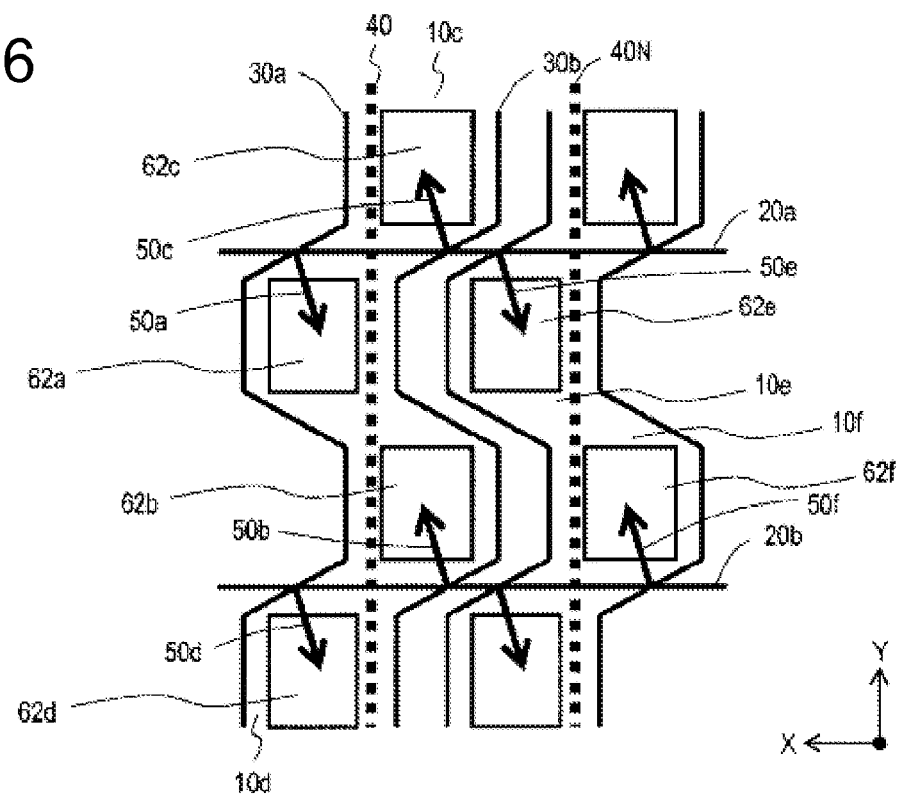
FIGS. 6(a) and 6(b) are schematic plan views that respectively show fourth and fifth modification examples of the pixel configuration of Embodiment 1.
Figure 6:
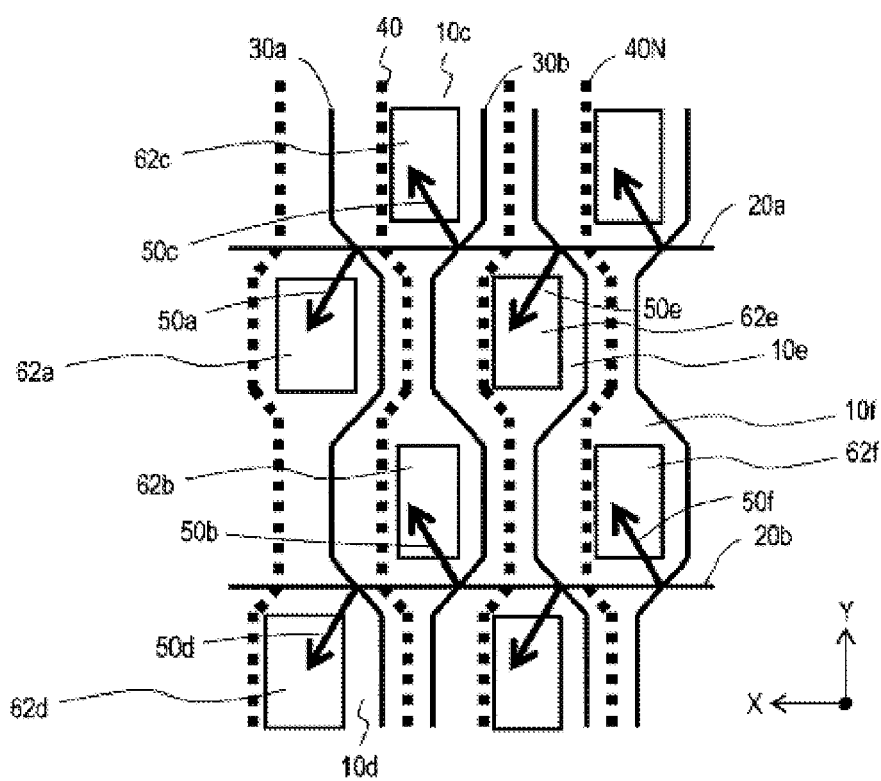

In the fourth modification example, as shown in FIG. 6(*a*), the signal lines 30*a* and 30*b* extend along the Y direction while bending, and the auxiliary capacitance lines 40 and 40N extends in a straight line along the Y direction. The TFT 50*a*, the auxiliary capacitance opposite electrode 62*a*, the TFT 50*d*, and the auxiliary capacitance opposite electrode 62*d* are located closer to the positive side of the auxiliary capacitance line 40 along the X direction, and the TFT 50*b*, the auxiliary capacitance opposite electrode 62*b*, the TFT 50*c*, and the auxiliary capacitance opposite electrode 62*c* are located closer to the negative side of the auxiliary capacitance line 40 along the X direction. The TFT 50*e* and the auxiliary capacitance opposite electrode 62*e* are located closer to the positive side of the auxiliary capacitance line 40N along the X direction, and the TFT 50*f* and the auxiliary capacitance opposite electrode 62*f* are located closer to the negative side of the auxiliary capacitance line 40N along the X direction.

In the fifth modification example, as shown in FIG. 6(*b*), the signal lines 30*a* and 30*b* and the auxiliary capacitance line 40 and 40N extend along the Y direction while bending. The TFT 50*a*, the auxiliary capacitance opposite electrode 62*a*, the TFT 50*d*, and the auxiliary capacitance opposite electrode 62*d* are located closer to the positive side of the auxiliary capacitance line 40 along the X direction, and the TFT 50*b*, the auxiliary capacitance opposite electrode 62*b*, the TFT 50*c*, and the auxiliary capacitance opposite electrode 62*c* are located closer to the negative side of the auxiliary capacitance line 40 along the X direction. The TFT 50*e* and the auxiliary capacitance opposite electrode 62*e* are located closer to the positive side of the auxiliary capacitance line 40N along the X direction, and the TFT 50*f* and the auxiliary capacitance opposite electrode 62*f* are located closer to the negative side of the auxiliary capacitance line 40N along the X direction.

Figure 7:
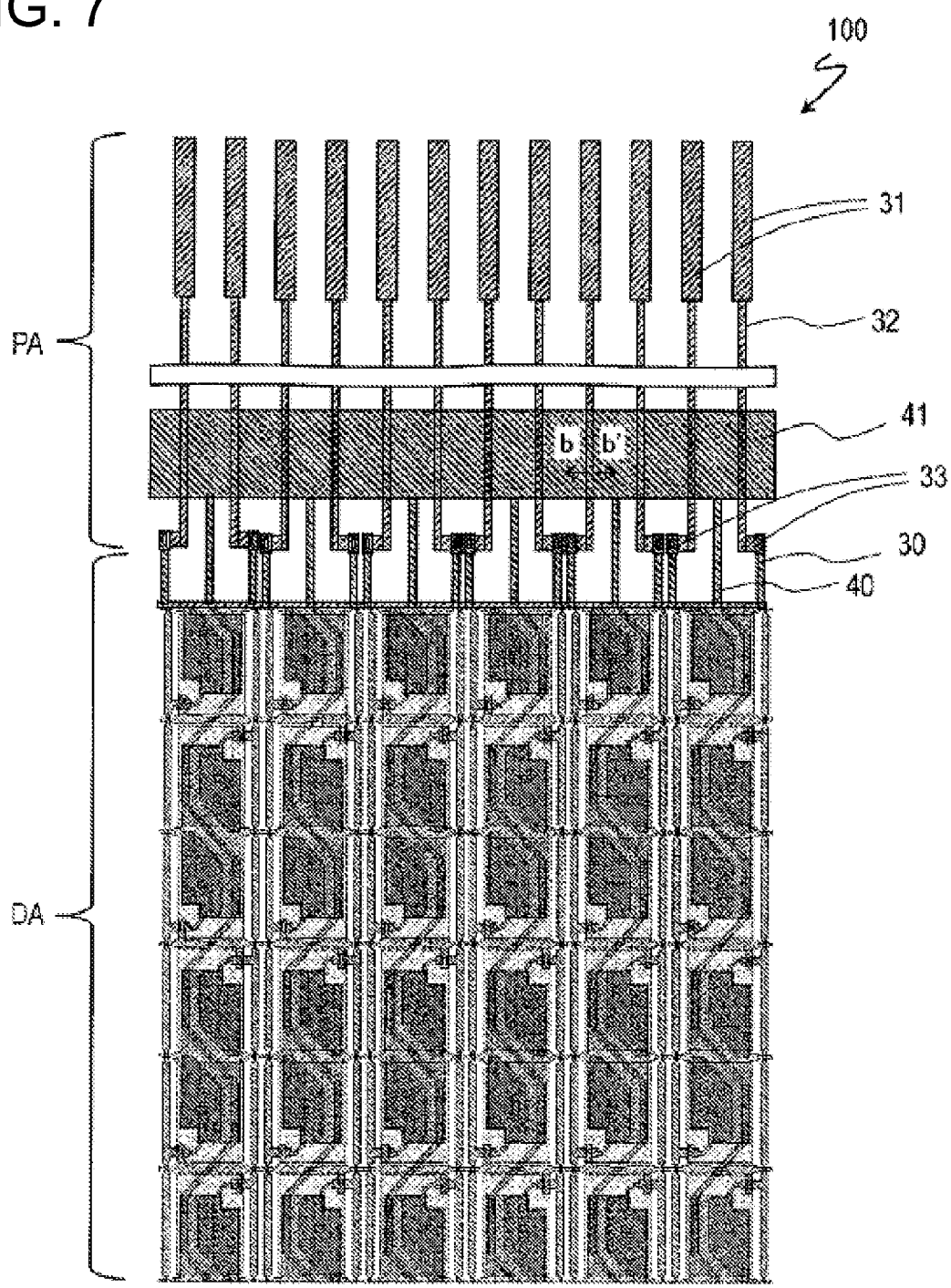
FIG. 7 is a plan view that schematically shows a configuration of a periphery region PA in the active matrix substrate 100.

Next, with reference to FIGS. 7 and 8, the arrangement of signal lines 30 and signal line terminals 31 in the active matrix substrate 100 will be explained. FIG. 7 is a schematic plan view of a configuration for the signal lines 30 and the signal line terminals 31, and FIG. 8 is a schematic cross-sectional view along the line b-b' of FIG. 7.

As shown in FIG. 7, the signal lines 30 are connected to the signal line terminals 31 through signal supply lines 32 that are disposed in the peripheral region PA so as to correspond to the respective signal lines 30. A plurality of auxiliary capacitance lines 40 are connected to the auxiliary capacitance main line 41.

Figure 8:
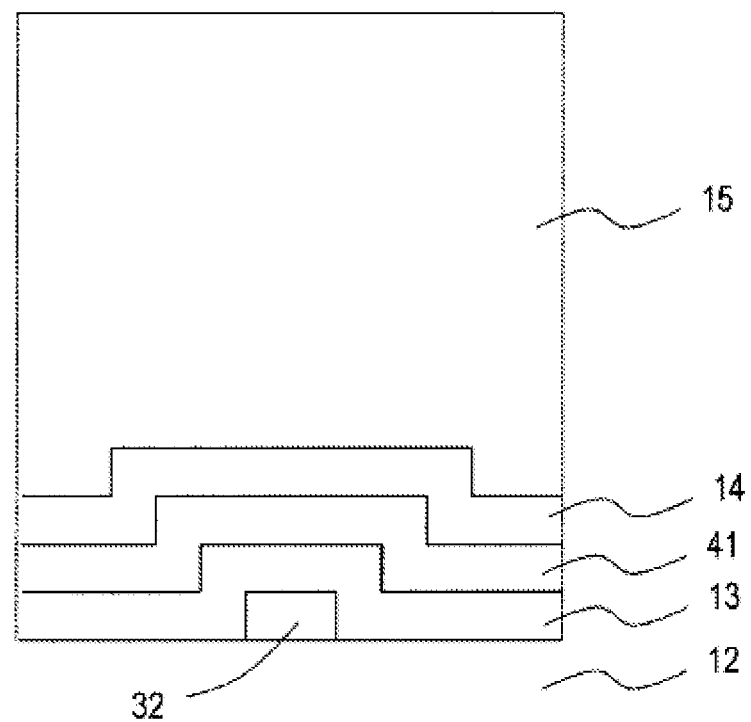
FIG. 8 is a schematic diagram showing a cross-sectional configuration of the periphery region PA along the line b-b' of FIG. 7.

As shown in FIG. 8, the signal supply lines 32 are disposed below the auxiliary capacitance main line 41 through the insulating layer 13. The signal lines 30 and the signal supply lines 32 are connected to each other through connecting portions 33 that respectively include contact holes formed in the insulating layer 13. With this arrangement, it is possible to prevent the signal lines 30, the auxiliary capacitance lines 40, and the auxiliary capacitance main line 41, which are formed in the same layer, from being electrically connected to each other.

Next, other embodiments (Embodiments 2 to 7) of the present invention will be explained. In the description below, the same constituting elements as those in Embodiment 1 are given the same reference characters, and detailed descriptions thereof are omitted. Except for the configurations described below, Embodiments 2 to 7 are the same as Embodiment 1, and similar effects can be obtained by the same constituting elements. The pixels 10*a* and the pixels 10*b* may be referred to as pixels 10 when there is no need to differentiate the two. The same is true for other constituting elements forming a pair such as the scan lines 20*a* and 20*b* and the signal lines 30*a* and 30*b*.

Embodiment 2

Figure 9:
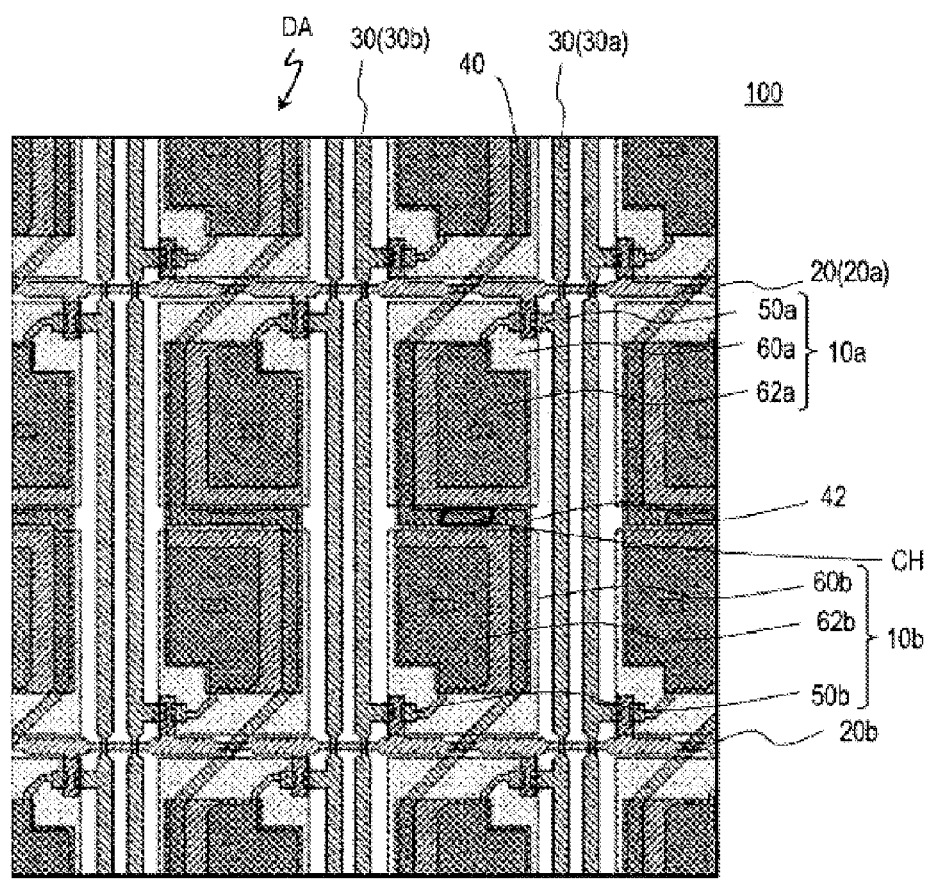
FIG. 9 is a plan view that schematically shows a configuration of an active matrix substrate 100 according to Embodiment 2 of the present invention.

FIG. 9 is a plan view that schematically shows a configuration of a display section DA of an active matrix substrate 100 of Embodiment 2.

As shown in FIG. 9, in Embodiment 2, the auxiliary capacitance line 40 has a linear portion that extends along the Y direction in each of the pixels 10 and 10*b*, and a portion that extends along the X direction at the boundary between the pixel 10*a* and the pixel 10*b*. The auxiliary capacitance line 40 and the auxiliary capacitance electrode 42 are connected to each other through a contact hole CH formed in the insulating layer 13 above the portion of the auxiliary capacitance line 40 extending in the X direction. The present embodiment also includes a configuration in which the auxiliary capacitance line 40 and the auxiliary capacitance electrode 42 are connected to each other through two contact holes CH as in Embodiment 1.

With the active matrix substrate 100 of Embodiment 2, it is possible to make the area of the auxiliary capacitance opposite electrode 62 larger than that in Embodiment 1, which allows for higher quality display and higher quality data acquisition. A contact hole that connects the auxiliary capacitance electrode 42 to the auxiliary capacitance line 40 is disposed between the pixel electrodes 60*a* and 60*b*. This way, even when there is a connection problem and the like in the contact hole, which needs to be repaired through melting by laser radiation, a risk of causing damage to the pixel electrode is reduced. That is, secondary defects such as leaking due to spattering of the pixel electrode can be avoided.

Embodiment 3

Figure 10:
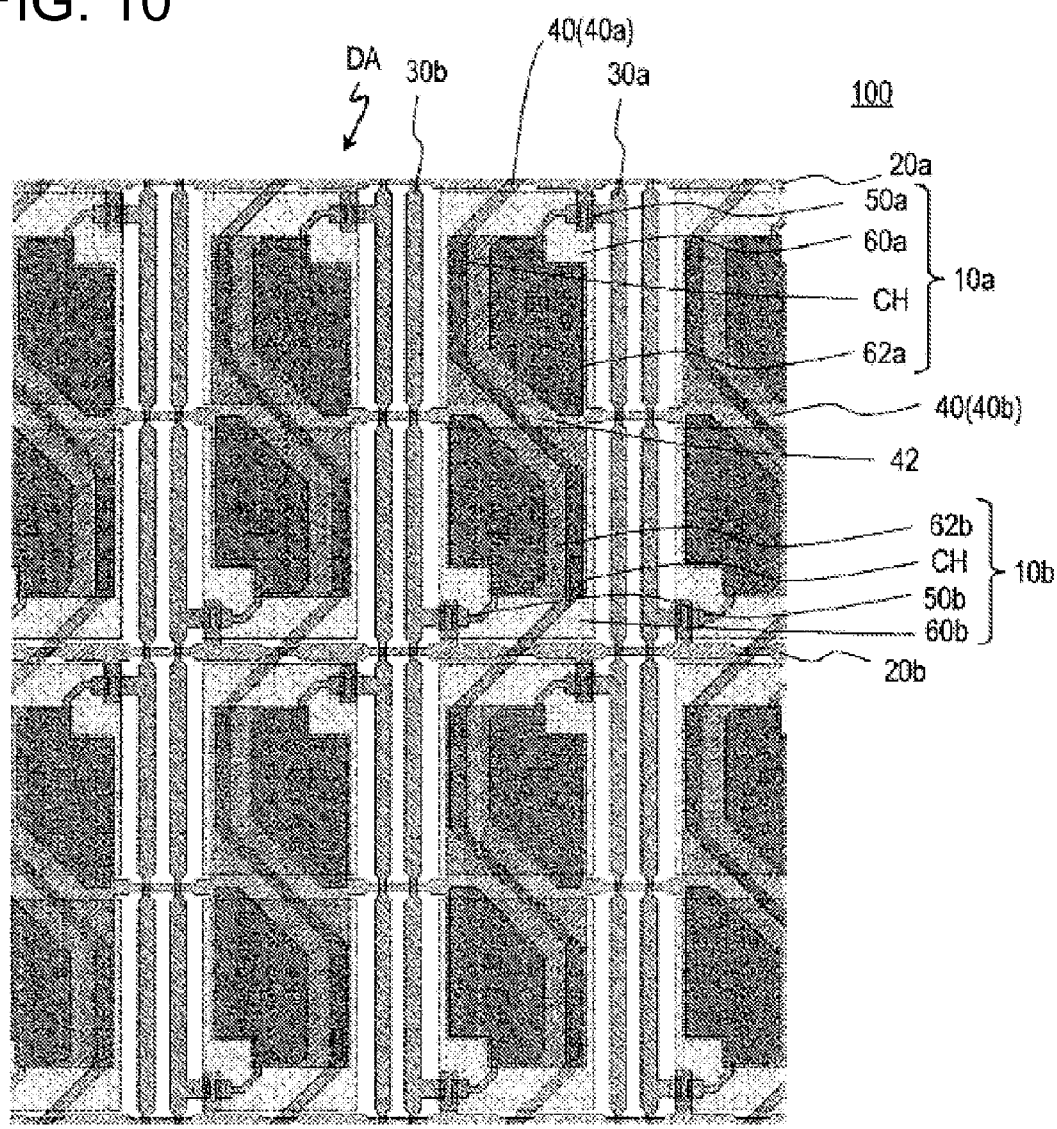
FIG. 10 is a plan view that schematically shows a configuration of an active matrix substrate 100 according to Embodiment 3 of the present invention.

FIG. 10 is a diagram that schematically shows a configuration of a display section DA of an active matrix substrate 100 of Embodiment 3.

As shown in FIG. 10, in Embodiment 3, an auxiliary capacitance line (second auxiliary capacitance line) 40*b* extends in the X direction along the boundary between the pixel 10*a* and the pixel 10*b*, in addition to the auxiliary capacitance line 40. The auxiliary capacitance line 40*b* and the auxiliary capacitance electrode 42 are obtained by patterning a metal layer deposited on the substrate in the same step. Therefore, the auxiliary capacitance line 40*b* and the auxiliary capacitance electrode 42 are formed in the same layer using the same material. The auxiliary capacitance electrode 42 can be considered as a part of the auxiliary capacitance line 40*b* that is extended below the pixels 10*a* and 10*b*.

With this configuration, the wiring resistance of the auxiliary capacitance line can be reduced, and the resistance distribution of the display section can be reduced. As a result, it makes possible higher quality display and higher quality data acquisition. Because respective auxiliary capacitance electrodes 42 adjacent to each other in the X direction are connected to each other when the auxiliary capacitance electrodes 42 are formed, a defect caused by static buildup can be mitigated.

Embodiment 4

Figure 11:
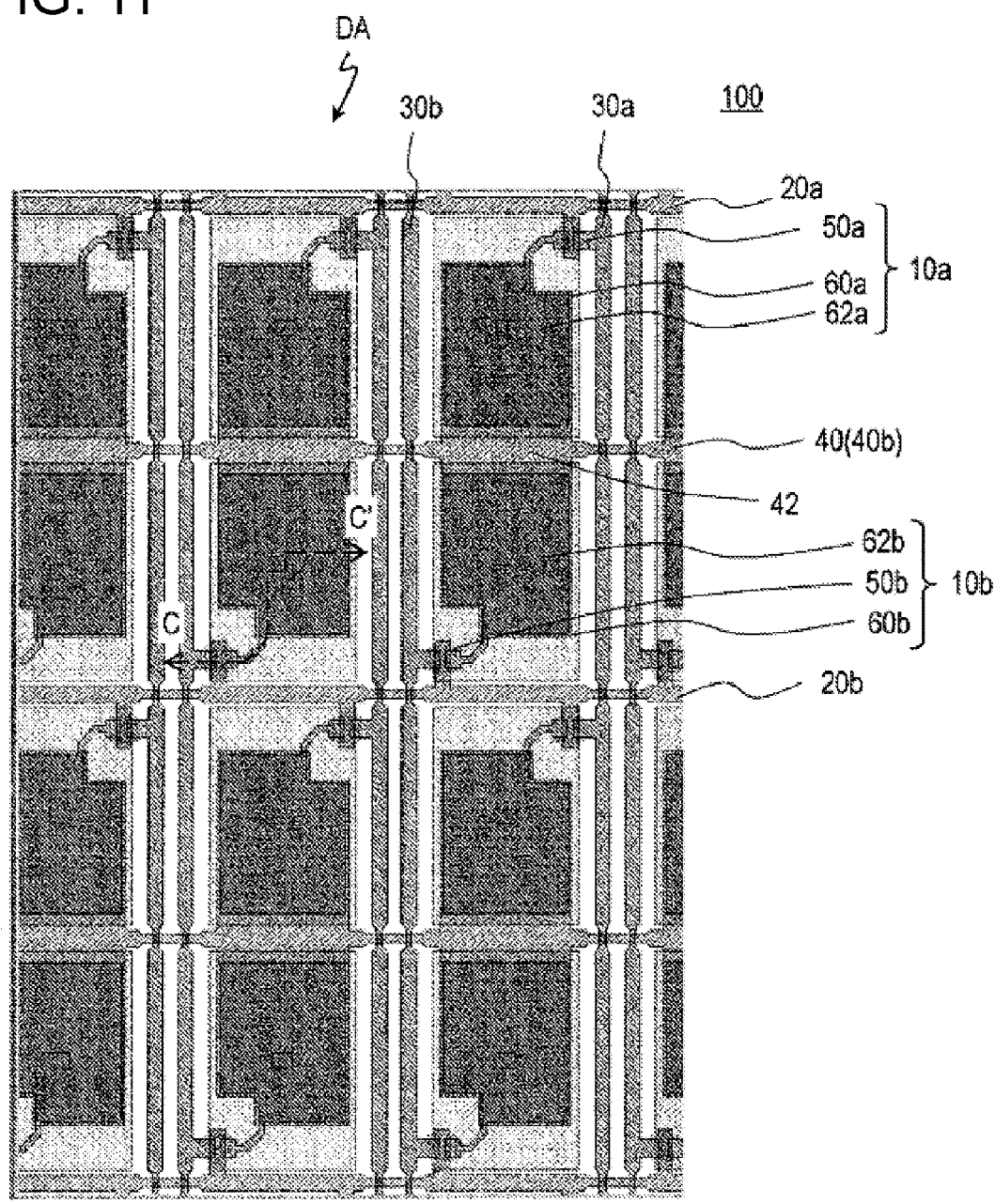
FIG. 11 is a plan view that schematically shows a configuration of an active matrix substrate 100 according to Embodiment 4 of the present invention.
Figure 12:
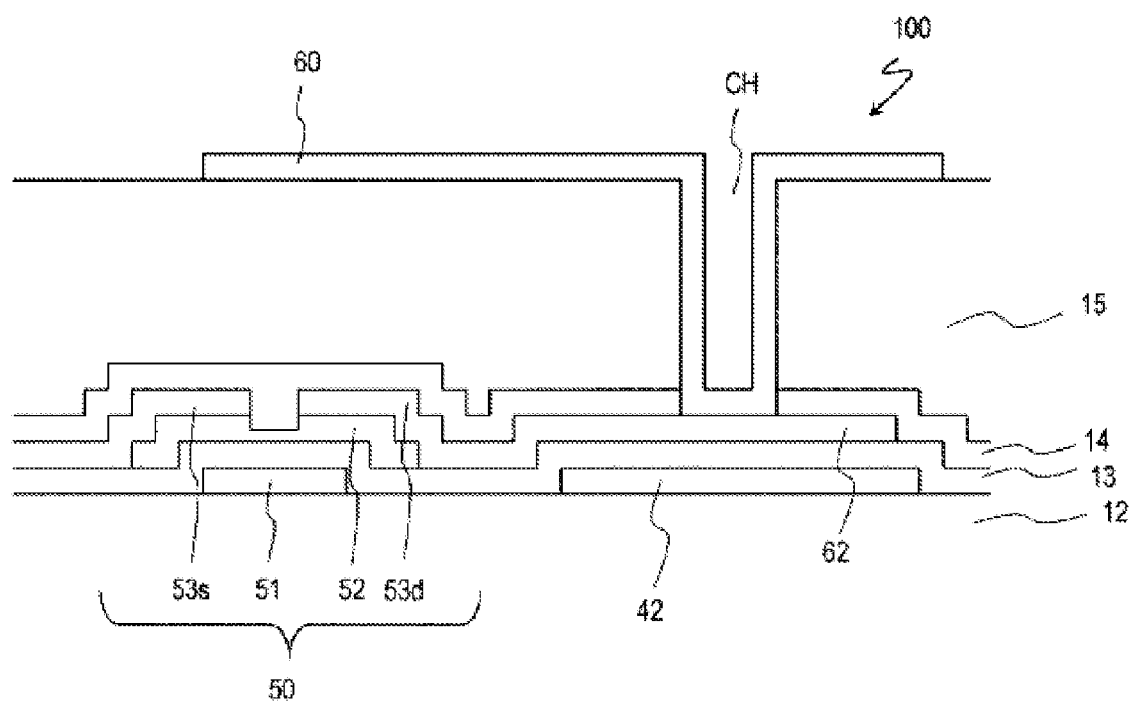
FIG. 12 is a schematic cross-sectional view of a configuration of the active matrix substrate 100 along the line c-c' of FIG. 11.

FIG. 11 is a plan view that schematically shows a configuration of a display section DA of an active matrix substrate 100 of Embodiment 4, and FIG. 12 is a diagram that schematically shows a cross-sectional configuration along the line c-c' of FIG. 11.

As shown in FIG. 11, Embodiment 4 has the same configuration as Embodiment 3 except that the auxiliary capacitance line 40 is not provided, and the auxiliary capacitance electrode 42 is connected only to the auxiliary capacitance line 40b. As shown in FIG. 12, a TFT 50 includes: a gate electrode 51 formed on a substrate 12, a semiconductor layer 52 formed on an insulating layer 13, and source electrode 53s and drain electrode 53d that are formed to respectively cover portions of the semiconductor layer 52. On the source electrode 53s and the drain electrode 53d, an insulating layer 14 and an insulating layer 15 are layered in this order.

On the auxiliary capacitance electrode 42, the insulating layer 13, the auxiliary capacitance opposite electrode 62, the insulating layer 14, the insulating layer 15, and the pixel electrode 60 are layered in this order. The drain electrode 53d of the TFT 50 is connected to the auxiliary capacitance opposite electrode 62, and the auxiliary capacitance opposite electrode 62 is connected to the pixel electrode 60 through a contact hole CH formed through the insulating layers 14 and 15.

The cross-sectional configuration of the TFT 50 portion and the auxiliary capacitance portion shown in FIG. 12 is the same as that of Embodiment 1. In Embodiment 4, the auxiliary capacitance line 40 is not provided, unlike Embodiment 1. Therefore, it is possible to form the auxiliary capacitance opposite electrodes 62a and 62b so as to have the substantially same area as the auxiliary capacitance electrode 42 except for regions where the respective electrodes are close to each other. This makes it possible to increase the auxiliary capacitance of each pixel 10. Because intersections between the auxiliary capacitance lines 40 and the scan lines 20 are not formed, the quality of scan signals is improved. Furthermore, because it is not necessary to form contact holes CH in the insulating layer 13 to connect the auxiliary capacitance lines 40 to the auxiliary capacitance electrodes 42, the manufacturing efficiency is improved.

Next, a modification example of Embodiment 4 will be explained.

Figure 13:
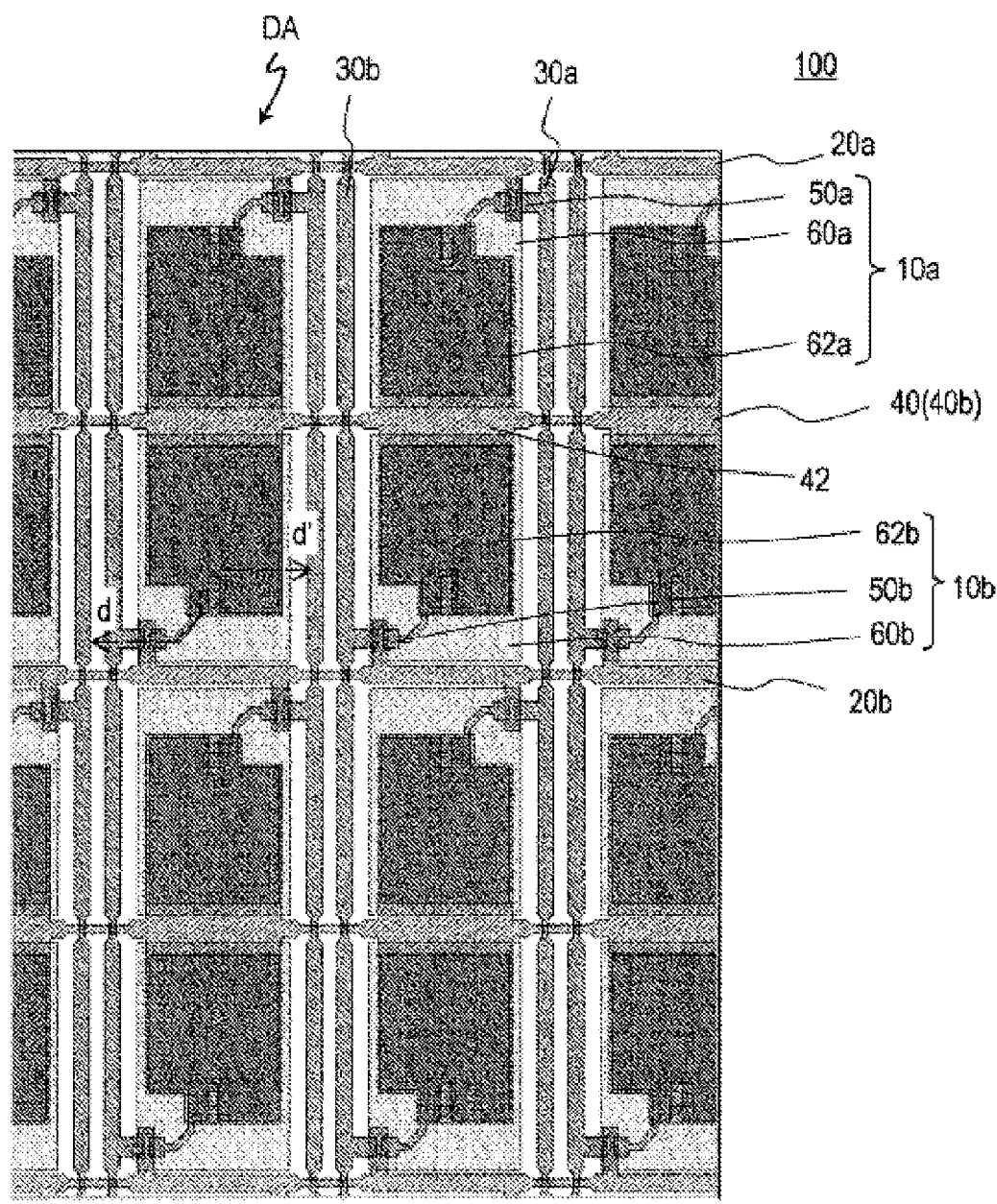
FIG. 13 is a schematic plan view of a configuration of a modification example of the active matrix substrate 100 of Embodiment 4 of the present invention.
Figure 14:
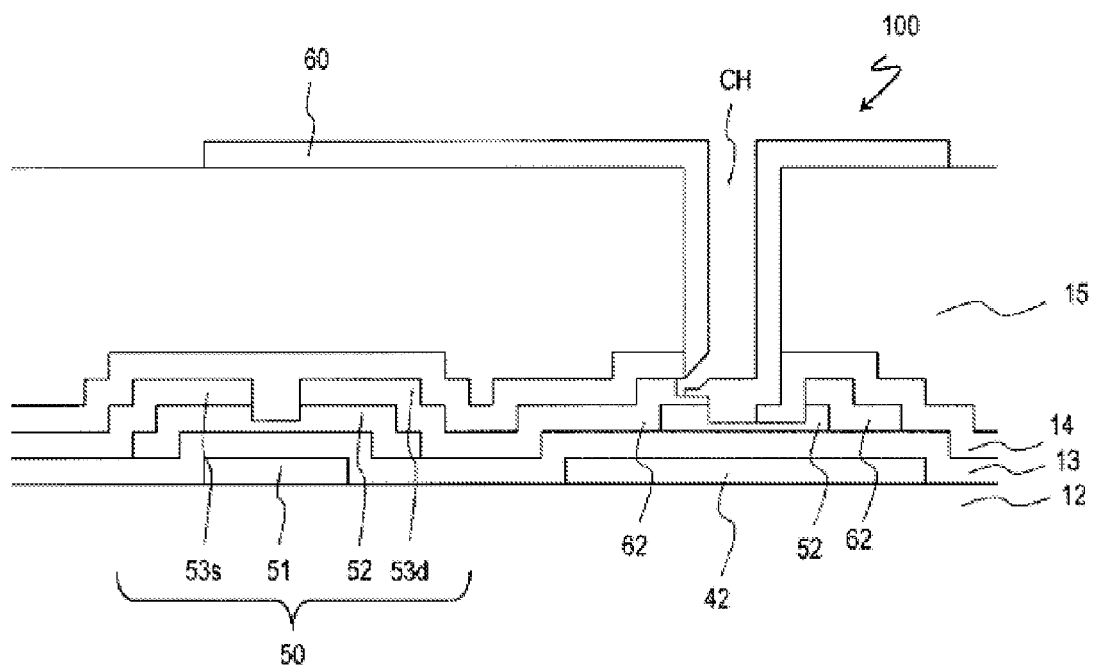
FIG. 14 is a schematic cross-sectional view of a configuration of the modification example of the active matrix substrate 100 of Embodiment 4 along the line d-d' of FIG. 13.

FIG. 13 is a plan view that schematically shows a configuration of a display section DA of the modification example of Embodiment 4, and FIG. 14 is a diagram that schematically shows a cross-sectional configuration along the line d-d' of FIG. 13.

As shown in FIG. 13, in a manner similar to Embodiment 4 above, the modification example has the same configuration as Embodiment 3 except that the auxiliary capacitance line 40 is not provided, and the auxiliary capacitance electrode 42 is connected only to the auxiliary capacitance line 40b. As shown in FIG. 14, the TFT 50 has the same configuration as that in Embodiment 4.

On the auxiliary capacitance electrode 42, an insulating layer 13, a semiconductor layer 52, an auxiliary capacitance opposite electrode 62, an insulating layer 14, an insulating layer 15, and a pixel electrode 60 are layered in this order. The semiconductor layer 52 is formed in the same step and of the same material as the semiconductor layer 52 of the TFT 50. The drain electrode 53d of the TFT 50 is connected to the auxiliary capacitance opposite electrode 62, and the auxiliary capacitance opposite electrode 62 is connected to the pixel electrode 60 through a contact hole CH that reaches the upper portion of the semiconductor layer 52 through the insulating layers 14 and 15 and the auxiliary capacitance opposite electrode 62.

Embodiment 5

Figure 15:
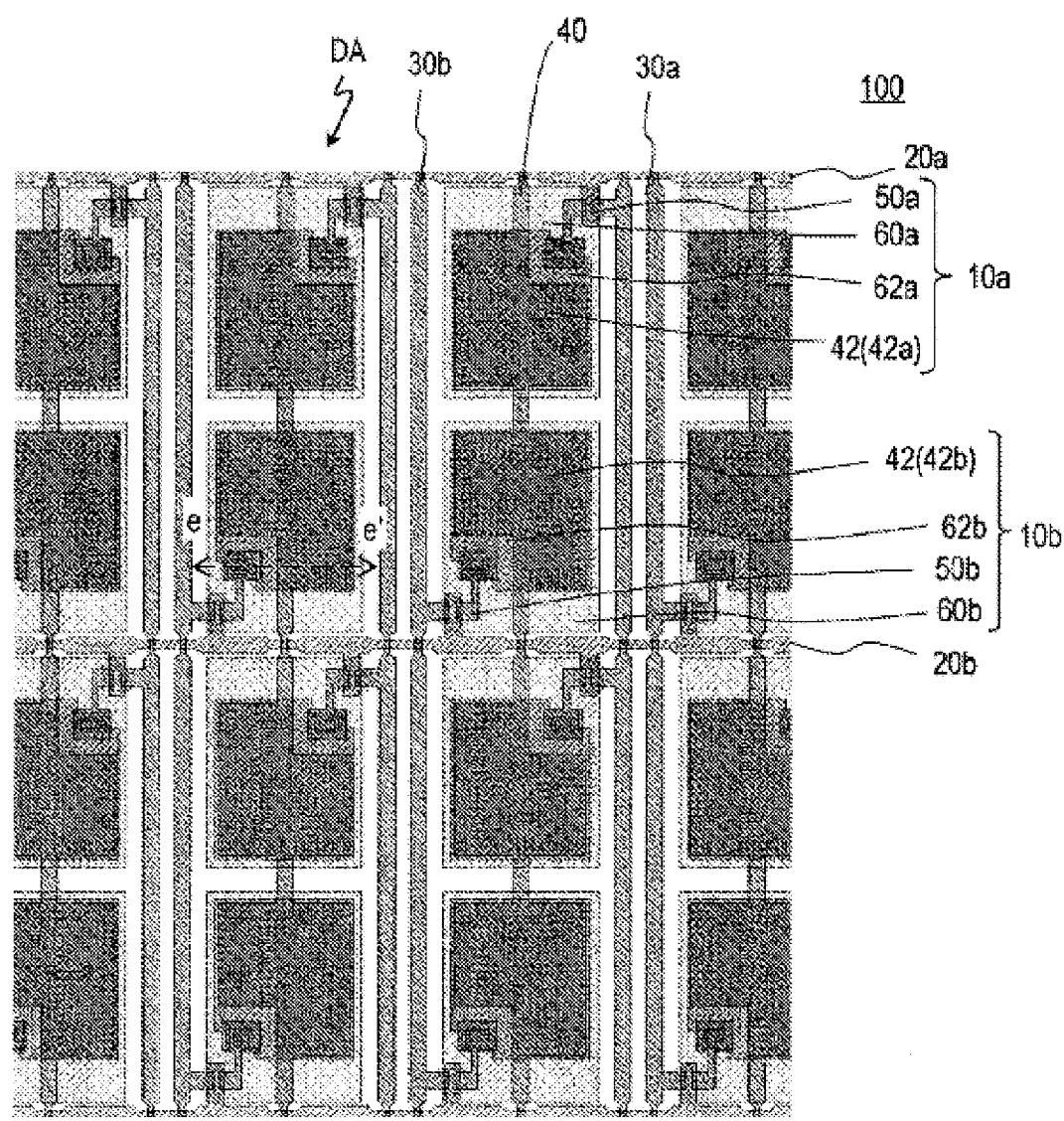
FIG. 15 is a plan view that schematically shows a configuration of an active matrix substrate 100 according to Embodiment 5 of the present invention.
Figure 16:
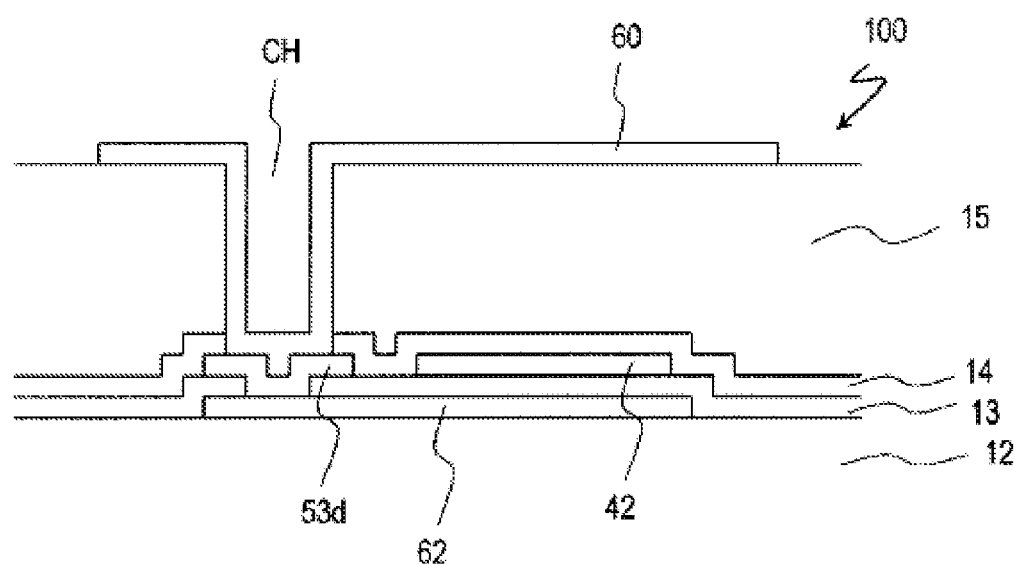
FIG. 16 is a schematic cross-sectional view of a configuration of the active matrix substrate 100 of Embodiment 5 along the line e-e' of FIG. 15.

FIG. 15 is a plan view that schematically shows a configuration of a display section DA of an active matrix substrate 100 of Embodiment 5, and FIG. 16 is a diagram that schematically shows a cross-sectional configuration along the line e-e' of FIG. 15.

As shown in FIG. 15, in Embodiment 5, the auxiliary capacitance line 40 extends along the Y direction, passing through the approximate center of the pixels 10. As shown in FIG. 16, the auxiliary capacitance electrode 42 is formed in the same layer as the drain electrode 53d of the TFT 50 (the same layer as the source electrode, the auxiliary capacitance line 40, and the signal lines 30). The auxiliary capacitance electrode 42 is formed in the same step as the drain electrodes 53d, the source electrodes, the auxiliary capacitance lines 40, and the signal lines 30 using the same material. The auxiliary capacitance electrode 42 can be considered as a part of the auxiliary capacitance line 40 that is extended throughout the pixel 10.

The auxiliary capacitance opposite electrodes 62 are formed in the same layer as the scan lines 20 and the gate electrodes of the TFTs 50. The auxiliary capacitance opposite electrodes 62 are formed in the same step as the scan lines 20 and the gate electrodes at the same time, using the same material. The auxiliary capacitance opposite electrode 62 and the drain electrode 53d are connected to each other through a contact hole CH formed in the insulating layer 13, and the drain electrode 53d and the pixel electrode 60 are connected to each other through a contact hole CH formed in the insulating layers 14 and 15.

The auxiliary capacitance in each pixel 10 is formed between the auxiliary capacitance electrode 42 and the auxiliary capacitance opposite electrode 62, and between the auxiliary capacitance electrode 42 and the pixel electrode 60. This means that it is not necessary to form a contact hole for connecting the auxiliary capacitance line 40 to the auxiliary capacitance electrode 42, and therefore, the manufacturing efficiency is improved.

Next, a modification example of Embodiment 5 will be explained.

Figure 17:
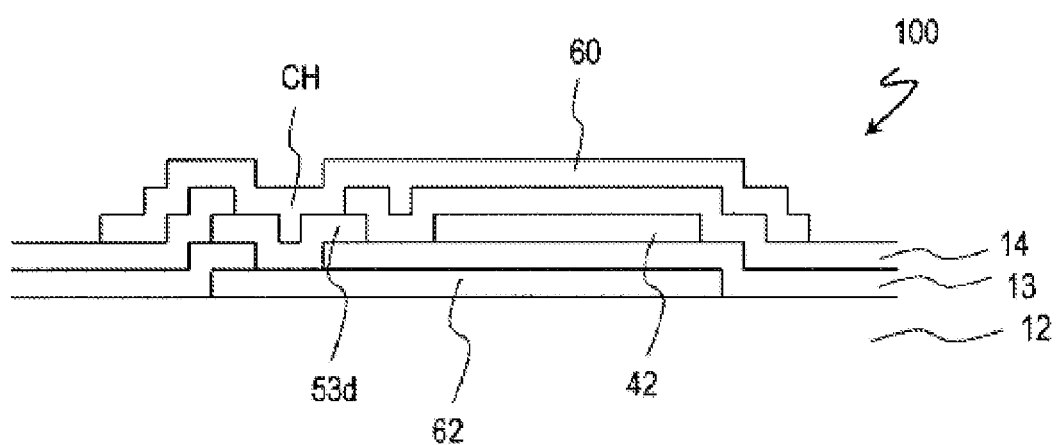
FIG. 17 is a schematic diagram showing a modification example of the cross-sectional configuration along the line e-e' of FIG. 15.

FIG. 17 is a cross-sectional view that schematically shows a configuration of the modification example, showing a schematic configuration corresponding to the cross-section along the line e-e' in FIG. 15.

The active matrix substrate 100 of the modification example basically has the same configuration as that shown in FIGS. 15 and 16. However, as shown in FIG. 17, the insulating layer 15 is not provided, and an insulating layer 14 that has a relative permittivity similar to that of an insulating layer 13 is formed to a thickness equivalent to that of the insulating layer 13. Thus, in the present embodiment, the auxiliary capacitance can be approximately twice that of the configuration in which the auxiliary capacitance electrodes 42 are formed in the same layer as the scan lines 20. When it is necessary to form the insulating layer 15 in a region other than the region shown in the figure, unwanted portions of the insulating layer 15 are removed by photolithography using a normal exposure process or a half-tone exposure. Even with the modification example, the same effects as those in Embodiment 5 described above can be obtained. If the insulating layer 15 is not formed at all, the manufacturing efficiency is improved.

Embodiment 6

Figure 18:
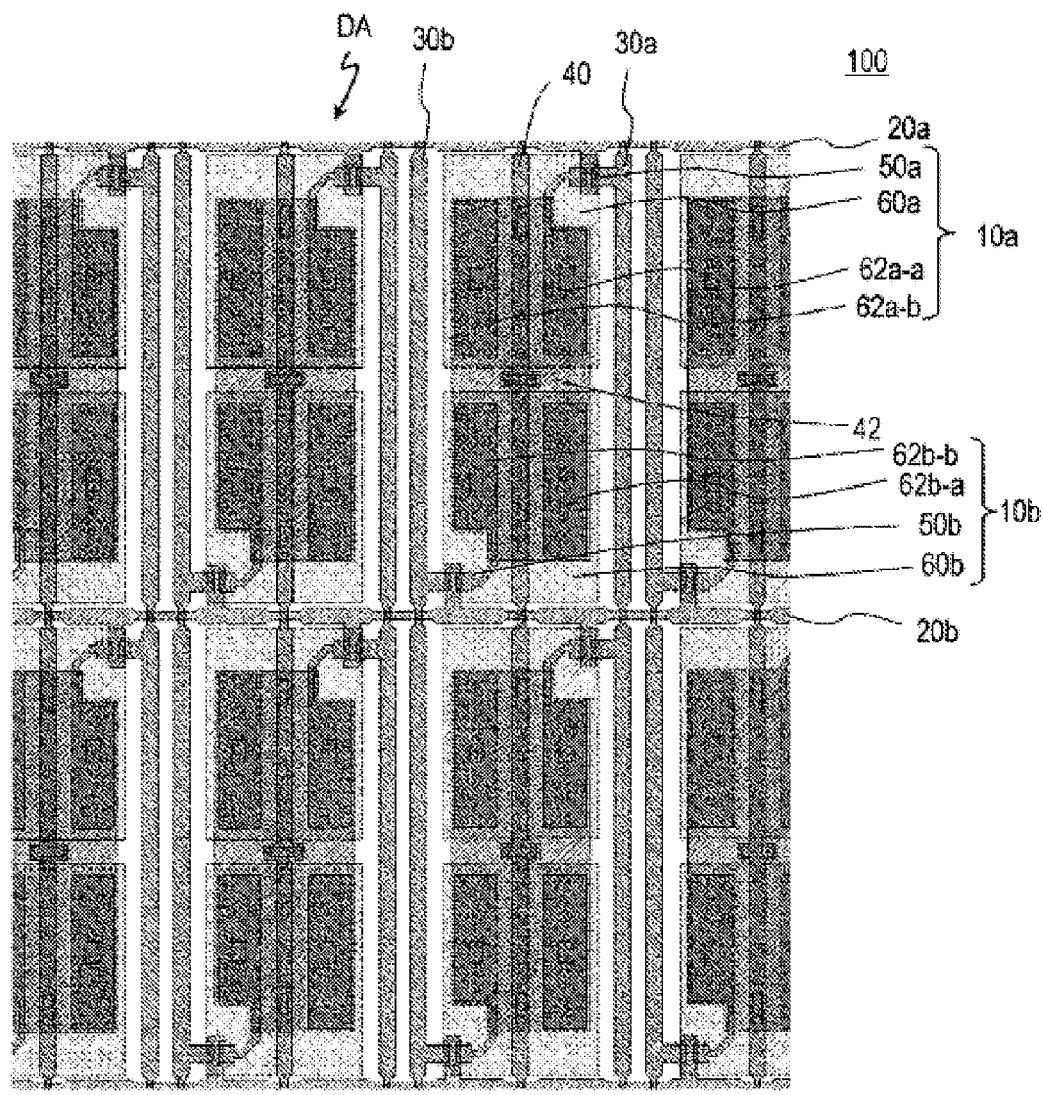
FIG. 18 is a plan view that schematically shows a configuration of an active matrix substrate 100 according to Embodiment 6 of the present invention.

FIG. 18 is a plan view that schematically shows a configuration of a display section DA of an active matrix substrate 100 of Embodiment 6.

As shown in FIG. 18, in Embodiment 6, the auxiliary capacitance line 40 extends along the Y direction, passing through the approximate center of the pixels 10. As in Embodiment 1, the auxiliary capacitance electrodes 42 are formed in the same layer as the scan lines 20 and the gate electrodes of the TFTs 50. The auxiliary capacitance opposite electrodes 62 are formed in the same layer as the source electrodes and drain electrodes of the TFTs 50, the auxiliary capacitance lines 40, and the signal lines 30.

Each of the auxiliary capacitance line 40 extends in a straight line along the Y direction, passing through the approximate center of the pixels 10. In each pixel 10, the auxiliary capacitance opposite electrode 62 is divided into two sections at the auxiliary capacitance line 40 (62a-a and 62a-b in the pixel 10a, and 62b-a and 62b-b in the pixel 10b). The auxiliary capacitance line 40 and the auxiliary capacitance electrode 42 are connected to each other through a contact hole formed below the auxiliary capacitance line 40 in the pixel 10a, a contact hole formed below the auxiliary capacitance line 40 in the pixel 10b, and a contact hole formed at the boundary between the pixel 10a and the pixel 10b. Instead of three contact holes, the auxiliary capacitance line 40 and the auxiliary capacitance electrode 42 may be connected through one or two of the three contact holes.

In the pixel 10a, the auxiliary capacitance opposite electrode 62a-a is connected to the drain electrode of the TFT 50a, and is connected to the pixel electrode 60a through a contact hole. The auxiliary capacitance opposite electrode 62a-b is connected to the pixel electrode 60a through a contact hole without being connected to the drain electrode of the TFT 50a. In the pixel 10b, the auxiliary capacitance opposite electrode 62b-a is connected to the pixel electrode 60b without being connected to the drain electrode of the TFT 50b. The auxiliary capacitance opposite electrode 62b-b is connected to the drain electrode of the TFT 50b, and is connected to the pixel electrode 60b through a contact hole.

Embodiment 7

Figure 19:
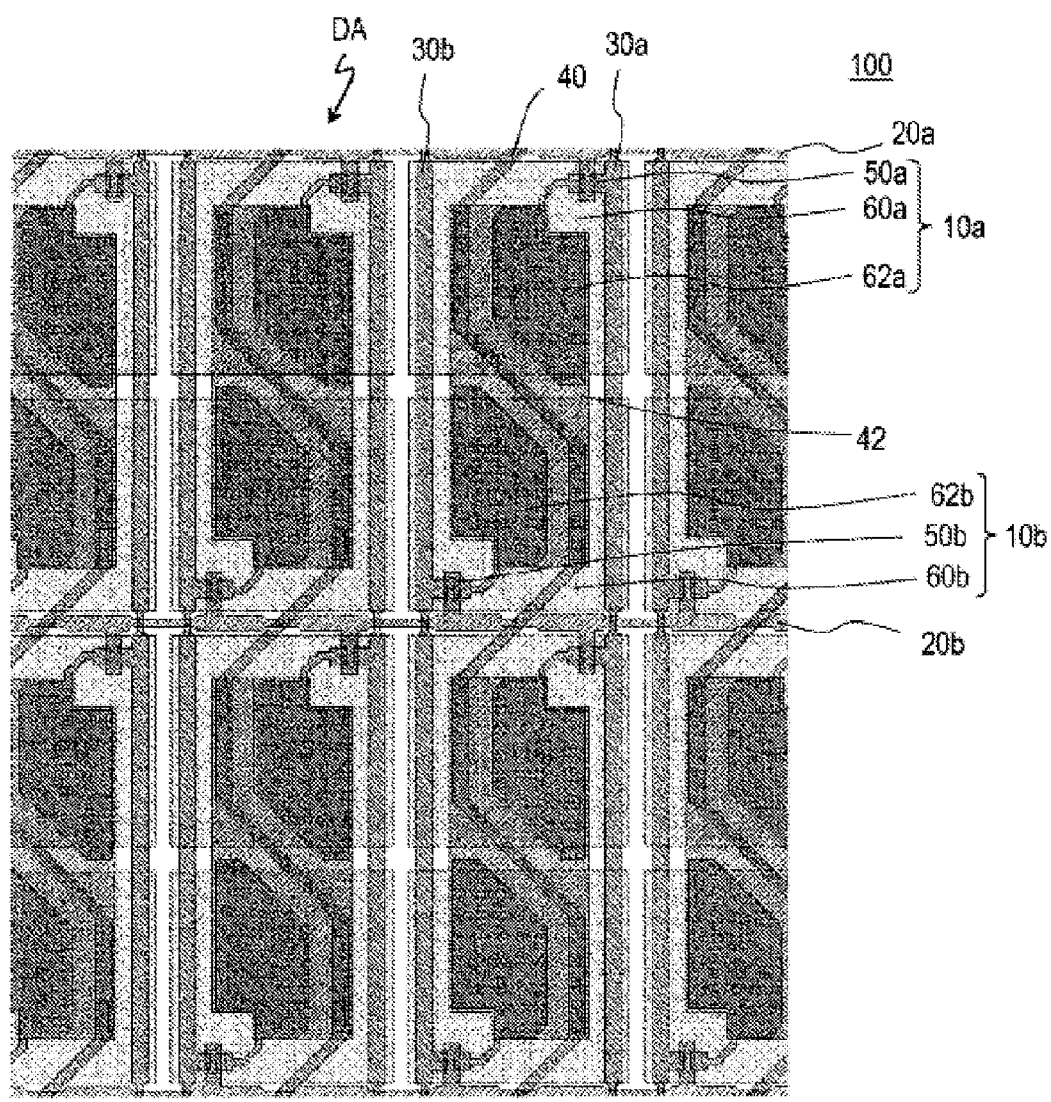
FIG. 19 is a plan view that schematically shows a configuration of an active matrix substrate 100 according to Embodiment 7 of the present invention.
Figure 20:
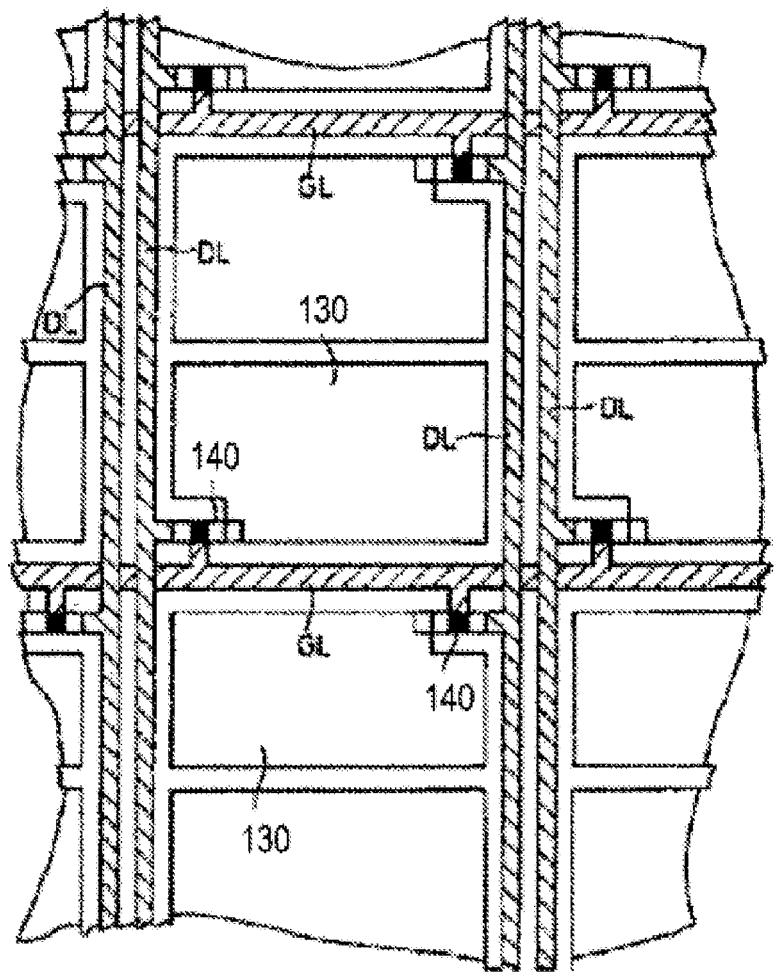
FIG. 20 is a plan view showing a part of a plurality of pixels in the active matrix substrate disclosed in Patent Document 1.
Figure 21:
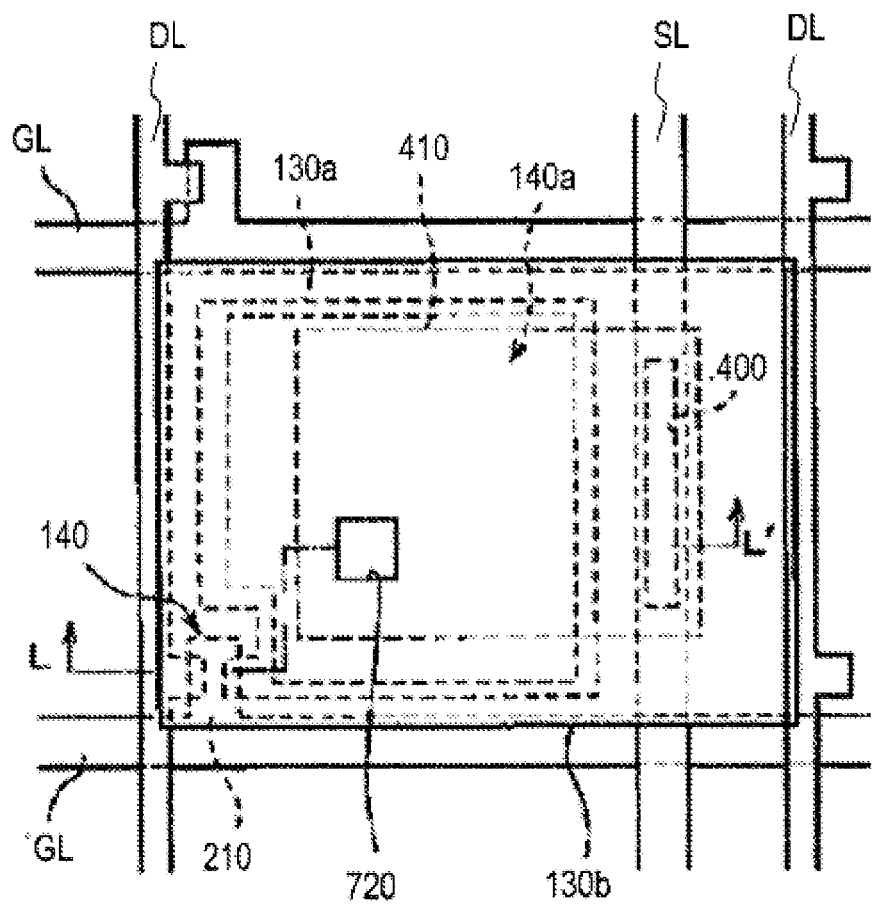
FIG. 21 is a plan view showing a configuration of pixels in the active matrix substrate disclosed in Patent Document 2.

FIG. 19 is a plan view that schematically shows a configuration of a display section DA of an active matrix substrate 100 of Embodiment 7.

As shown in FIG. 19, the display section DA of Embodiment 7 basically has the same configuration as that of Embodiment 1. However, in the present embodiment, the pixel electrodes 60a and 60b are extended to cover the signal lines 30a and 30b. This way, in addition to the advantages provided by Embodiment 1, it is possible to obtain an effect of reducing light leakage in the display. Also, when the active matrix substrate 100 is used for a liquid crystal display device, electric fields are less likely to leak from the signal lines 30a and 30b, which makes it possible to prevent orientation anomaly of the liquid crystal due to the electrical field leakage.

Modification examples of the present embodiment include a configuration in which the TFT 50 is replaced with two TFTs arranged in series in each pixel 10. In other words, respective gate electrodes of the two TFTs are connected in parallel to a single scan line 20. The source electrode and the drain electrode of one TFT is respectively connected to a scan line 30 and the source electrode of the other TFT, and the drain electrode of the other TFT is connected to an auxiliary capacitance opposite electrode 62 or a pixel electrode 60.

With this modification example, a leak current that is generated during a non-select period of TFTs can be reduced. Therefore, the active matrix substrate 100 of this modification example can be suitably used for a liquid crystal display device of low power consumption, which is driven with a low frequency, an electronic paper, and the like in which a voltage needs to be maintained for a relatively long period of time.

INDUSTRIAL APPLICABILITY

The embodiments of the present invention can be suitably applied to an electronic paper, a display device, an electronic writing device, a liquid crystal display device, an organic EL display device, a flexible display, an image sensor, an X-ray sensor, and the like that utilize the electrophoresis method and the like.

DESCRIPTION OF REFERENCE CHARACTERS 10 pixel
12 substrate
13 insulating layer (first inorganic insulating film)
14 insulating layer (second inorganic insulating film)
15 insulating layer (organic insulating film)
20 scan line (gate bus line)
21 scan line terminal
30 signal line (source bus line)
31 signal line terminal
32 signal supply line
33 connecting portion
40 auxiliary capacitance line (Cs line)
41 auxiliary capacitance main line
42 auxiliary capacitance electrode (Cs electrode)
45 auxiliary capacitance line terminal
50 TFT
51 gate electrode
52 semiconductor layer
53s source electrode
53d drain electrode
60 pixel electrode
62 auxiliary capacitance opposite electrode (Cs opposite electrode)

The invention claimed is:
1. An active matrix substrate, comprising:
a plurality of scan lines extending along a first direction, the plurality of scan lines including a first scan line and a second scan line that are adjacent to each other;
a plurality of signal lines extending along a second direction, the plurality of signal lines including a first signal line and a second signal line that are adjacent to each other;
a plurality of pixels arranged in a matrix, the plurality of pixels including a first pixel and a second pixel that are adjacent to each other along the second direction;
an auxiliary capacitance line;
a first pixel electrode for the first pixel and a second pixel electrode for the second pixel that are disposed in a region surrounded by the first scan line, the second scan line, the first signal line, and the second signal line;
a first TFT for the first pixel, the first TFT being connected to the first signal line;
a second TFT for the second pixel, the second TFT being connected to the second signal line;
an auxiliary capacitance electrode connected to the auxiliary capacitance line, the auxiliary capacitance electrode extending under the first pixel electrode and the second pixel electrode;
a first auxiliary capacitance opposite electrode for the first pixel, the first auxiliary capacitance opposite electrode being connected to the first pixel electrode; and a second auxiliary capacitance opposite electrode for the second pixel, the second auxiliary capacitance opposite electrode being connected to the second pixel electrode, wherein the auxiliary capacitance line extends along the second direction, wherein the first TFT is positioned on a positive side of the auxiliary capacitance line along the first direction, wherein the second TFT is positioned on a negative side of the auxiliary capacitance line along the first direction, wherein the auxiliary capacitance line extends along the second direction while bending, wherein the first auxiliary capacitance opposite electrode is positioned on said positive side of the auxiliary capacitance line along the first direction, and wherein the second auxiliary capacitance opposite electrode is positioned on said negative side of the auxiliary capacitance line along the first direction.

2. The active matrix substrate according to claim 1, wherein the auxiliary capacitance line has a section extending along the second direction and a section extending at an angle relative to the second direction in the first and second pixels.

3. The active matrix substrate according to claim 1, wherein the auxiliary capacitance line has a section extending in a straight line along the first direction in the first pixel, a section extending in a straight line along the second direction at a boundary between the first and second pixels, and a section extending in a straight line along the first direction in the second pixel.

4. The active matrix substrate according to claim 1, further comprising a second auxiliary capacitance line extending along the first direction, the second auxiliary capacitance line being connected to the auxiliary capacitance electrode, wherein the auxiliary capacitance electrode and the second auxiliary capacitance line are made of the same material.

5. An active matrix substrate, comprising:

a plurality of scan lines extending along a first direction, the plurality of scan lines including a first scan line and a second scan line that are adjacent to each other;

a plurality of signal lines extending along a second direction, the plurality of signal lines including a first signal line and a second signal line that are adjacent to each other;

a plurality of pixels arranged in a matrix, the plurality of pixels including a first pixel and a second pixel that are adjacent to each other along the second direction;

an auxiliary capacitance line;

a first pixel electrode for the first pixel and a second pixel electrode for the second pixel that are disposed in a region surrounded by the first scan line, the second scan line, the first signal line, and the second signal line;

a first TFT for the first pixel, the first TFT being connected to the first signal line;

a second TFT for the second pixel, the second TFT being connected to the second signal line;

an auxiliary capacitance electrode connected to the auxiliary capacitance line, the auxiliary capacitance electrode extending under the first pixel electrode and the second pixel electrode;

a first auxiliary capacitance opposite electrode for the first pixel, the first auxiliary capacitance opposite electrode being connected to the first pixel electrode; and a second auxiliary capacitance opposite electrode for the second pixel, the second auxiliary capacitance opposite electrode being connected to the second pixel electrode, wherein the auxiliary capacitance line extends along the second direction, wherein the first TFT is positioned on a positive side of the auxiliary capacitance line along the first direction, wherein the second TFT is positioned on a negative side of the auxiliary capacitance line along the first direction, wherein the auxiliary capacitance line extends in a straight line along the second direction, wherein the first auxiliary capacitance opposite electrode is divided into a first section and a second section, the first section being positioned on said positive side of the auxiliary capacitance line along the first direction, the second section being positioned on said negative side of the auxiliary capacitance line along the first direction, and wherein the second auxiliary capacitance opposite electrode is divided into a first section and a second section, the first section being positioned on said positive side of the auxiliary capacitance line along the first direction, the second section being positioned on said negative side of the auxiliary capacitance line along the first direction.

6. The active matrix substrate according to claim 5, wherein the first section of the first auxiliary capacitance opposite electrode is connected to a drain electrode of the first TFT, wherein the first section and the second section of the first auxiliary capacitance opposite electrode are respectively connected to the first pixel electrode through contact holes, wherein the second section of the second auxiliary capacitance opposite electrode is connected to a drain electrode of the second TFT, and wherein the first section and the second section of the second auxiliary capacitance opposite electrode are respectively connected to the second pixel electrode through contact holes.

7. The active matrix substrate according to claim 1, further comprising:

a fifth pixel adjacent to the first pixel across the first signal line;

a sixth pixel adjacent to the second pixel across the first signal line;

a fifth TFT for the fifth pixel, the fifth TFT being connected to the first scan line;

a sixth TFT for the sixth pixel, the sixth TFT being connected to the second scan line;

a fifth auxiliary capacitance opposite electrode for the fifth pixel, the fifth auxiliary capacitance opposite electrode being connected to a pixel electrode of the fifth pixel;

a sixth auxiliary capacitance opposite electrode for the sixth pixel, the sixth auxiliary capacitance opposite electrode being connected to a pixel electrode of the sixth pixel; and another auxiliary capacitance line that extends along the second direction, passing through the fifth pixel and the sixth pixel, wherein the fifth TFT and the fifth auxiliary capacitance opposite electrode are positioned on the negative side of said another auxiliary capacitance line along the first direction, and wherein the sixth TFT and the sixth auxiliary capacitance opposite electrode are positioned on the positive side of said another auxiliary capacitance line along the first direction.

8. An active matrix substrate, comprising:

a plurality of scan lines extending along a first direction, the plurality of scan lines including a first scan line and a second scan line that are adjacent to each other;

a plurality of signal lines extending along a second direction, the plurality of signal lines including a first signal line and a second signal line that are adjacent to each other;

a plurality of pixels arranged in a matrix, the plurality of pixels including a first pixel and a second pixel that are adjacent to each other along the second direction;

an auxiliary capacitance line;

a first pixel electrode for the first pixel and a second pixel electrode for the second pixel that are disposed in a region surrounded by the first scan line, the second scan line, the first signal line, and the second signal line;

a first TFT for the first pixel, the first TFT being connected to the first signal line;

a second TFT for the second pixel, the second TFT being connected to the second signal line;

an auxiliary capacitance electrode connected to the auxiliary capacitance line, the auxiliary capacitance electrode extending under the first pixel electrode and the second pixel electrode;

a first auxiliary capacitance opposite electrode for the first pixel, the first auxiliary capacitance opposite electrode being connected to the first pixel electrode; and a second auxiliary capacitance opposite electrode for the second pixel, the second auxiliary capacitance opposite electrode being connected to the second pixel electrode, wherein the auxiliary capacitance line extends along the first direction, wherein the first TFT and the first auxiliary capacitance opposite electrode are positioned on a positive side of the auxiliary capacitance line along the second direction, and wherein the second TFT and the second auxiliary capacitance opposite electrode are positioned on a negative side of the auxiliary capacitance line along the second direction.

9. The active matrix substrate according to claim 8, wherein a width of the auxiliary capacitance line at third intersections where the auxiliary capacitance line and the plurality of signal lines intersect is smaller than a width of the auxiliary capacitance line in other areas than the third intersections at boundaries between the plurality of pixels.

10. The active matrix substrate according to claim 9, wherein a width of the plurality of scan lines at fourth intersections where the plurality of signal lines and the plurality of scan lines intersect is smaller than a width of the plurality of scan lines at boundaries between the plurality of pixels.

11. The active matrix substrate according to claim 10, wherein a width of the plurality of signal lines at the third intersections and the fourth intersections is smaller than a width of the plurality of scan lines in other areas then the third intersections and the fourth intersections.

* * * * *